US012457878B2

(12) United States Patent
Kitazawa

(10) Patent No.: US 12,457,878 B2
(45) Date of Patent: Oct. 28, 2025

(54) LIGHT-EMITTING DEVICE HAVING DOUBLE-SIDED LIGHT EMISSIION FOR REDUCING A DIFFERENCE IN LIGHT EMITTED FROM DIFFERENT LIGHT EMISSION DIRECTION

(71) Applicant: SHARP KABUSHIKI KAISHA, Sakai (JP)

(72) Inventor: Tazuko Kitazawa, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 557 days.

(21) Appl. No.: 17/912,494

(22) PCT Filed: Apr. 28, 2020

(86) PCT No.: PCT/JP2020/018179
§ 371 (c)(1),
(2) Date: Sep. 17, 2022

(87) PCT Pub. No.: WO2021/220431
PCT Pub. Date: Nov. 4, 2021

(65) Prior Publication Data
US 2023/0125204 A1   Apr. 27, 2023

(51) Int. Cl.
*H10K 59/38*  (2023.01)
*H10K 50/115*  (2023.01)
(Continued)

(52) U.S. Cl.
CPC .......... *H10K 59/38* (2023.02); *H10K 50/115* (2023.02); *H10K 50/125* (2023.02); *H10K 50/15* (2023.02);
(Continued)

(58) Field of Classification Search
CPC .......... H10K 2102/3031; H10K 59/32; H10K 59/38; H10K 50/115; H10K 50/125;
(Continued)

(56) References Cited

U.S. PATENT DOCUMENTS 5,717,289 A    2/1998  Tanaka
10,756,285 B2 *  8/2020  Xu ........................ H10K 50/115
(Continued)

FOREIGN PATENT DOCUMENTS

CN    102694126 A    9/2012
JP    2006114452 A    4/2006
(Continued)

OTHER PUBLICATIONS

Takayuki Uchida et al., "Full Color Pixel with Vertical Stack of Individual Red, Green, and Blue Transparent Organic Light-Emitting Devices Based on Dye-Dispersed Poly(N-vinylcarbazole)", Japanese Journal of Applied Physics, 2006, pp. 7126-7128, vol. 45, No. 9A.

*Primary Examiner* — Chad M Dicke
*Assistant Examiner* — Jeremy Daniel Watts
(74) *Attorney, Agent, or Firm* — ScienBiziP, P.C.

(57) ABSTRACT

A light-emitting device emits light in a first direction and also emits light in a second direction opposite to the first direction. The light-emitting device includes a first light-emitting layer configured to emit light of a first color, and a second light-emitting layer configured to emit light of a second color different from the first color. The first light-emitting layer and the second light-emitting layer overlap each other as viewed from the first direction. The light-emitting device reduces a difference in tinge between emission light in the first direction and emission light in the second direction.

10 Claims, 36 Drawing Sheets

(51) Int. Cl.
*H10K 50/125* (2023.01)
*H10K 50/15* (2023.01)
*H10K 50/16* (2023.01)
*H10K 59/80* (2023.01)

(52) U.S. Cl.
CPC ....... *H10K 50/16* (2023.02); *H10K 59/80524* (2023.02)

(58) Field of Classification Search
CPC .. H10K 50/15; H10K 50/16; H10K 59/80524; H10K 50/131; H10K 59/35; H10K 59/30; H10K 59/10; H10K 59/176; H10K 59/70; H10K 59/80517; H10K 59/95; H05B 33/12; H05B 33/14; H05B 33/145; H05B 33/20; H05B 33/28
See application file for complete search history.

(56) References Cited

U.S. PATENT DOCUMENTS

| | | | |
|---|---|---|---|
| 2005/0062408 A1* | 3/2005 | Yoo | H10K 59/80524 313/500 |
| 2005/0093435 A1* | 5/2005 | Suh | H10K 59/38 313/506 |
| 2005/0184659 A1* | 8/2005 | Ibe | H10K 59/84 313/506 |
| 2006/0006792 A1* | 1/2006 | Strip | H10K 59/128 313/506 |
| 2006/0082295 A1* | 4/2006 | Chin | H10K 59/38 313/506 |
| 2007/0132379 A1* | 6/2007 | Huang | H10K 59/123 313/506 |
| 2013/0240849 A1 | 9/2013 | Chiang et al. | |
| 2016/0020421 A1 | 1/2016 | Joo et al. | |
| 2017/0117330 A1* | 4/2017 | Jiang | H10K 59/38 |
| 2018/0151630 A1 | 5/2018 | Yamaoka et al. | |
| 2018/0208836 A1 | 7/2018 | Kuma et al. | |
| 2019/0189697 A1 | 6/2019 | Jun et al. | |
| 2023/0013968 A1* | 1/2023 | Wang | H10K 59/32 |

FOREIGN PATENT DOCUMENTS

| | | |
|---|---|---|
| JP | 2007080604 A | 3/2007 |
| JP | 2008077987 A | 4/2008 |
| JP | 2018092932 A | 6/2018 |
| JP | 2018156721 A | 10/2018 |
| KR | 20180078848 A | 7/2018 |

* cited by examiner

LIGHT-EMITTING DEVICE HAVING DOUBLE-SIDED LIGHT EMISSIION FOR REDUCING A DIFFERENCE IN LIGHT EMITTED FROM DIFFERENT LIGHT EMISSION DIRECTION

TECHNICAL FIELD

The disclosure relates to a light-emitting device including a light-emitting element.

BACKGROUND ART

NPL 1 discloses an organic light-emitting device in which a red light-emitting layer, a green light-emitting layer, and a blue light-emitting layer formed on different transparent substrates are layered together.

CITATION LIST

Non Patent Literature

NPL 1: Full Color Pixel with Vertical Stack of Individual Red, Green, and Blue Transparent Organic Light-Emitting Devices Based on Dye-Dispersed Poly (N-vinylcarbazole) (Uchida, et al, Japanese Journal of Applied Physics Vol. 45, No. 9A, 2006, pp. 7126-7128.)

SUMMARY

Technical Problem

It is conceivable to apply a transparent layering-type light-emitting device as described in NPL 1 to a light-emitting device of double-sided light emission that can be visually recognized from both sides. In this case, when the light-emitting device is visually recognized from directions different from each other, a position, a distance, or the like of each of light-emitting layers from a light-emitting face may be different in each of the directions. Thus, a difference may occur in a tinge of light emission from the directions different from each other of the light-emitting device.

Solution to Problem

In order to solve the problem described above, a light-emitting device according to an aspect of the disclosure emits light in a first direction and also emits light in a second direction opposite to the first direction, and the light-emitting device includes: a first light-emitting layer configured to emit light of a first color; a second light-emitting layer configured to emit light of a second color different from the first color; a first electrode pair including a pair of a first anode electrode and a first cathode electrode; between the first electrode pair, a first electron transport layer on the first cathode electrode side; and a first hole transport layer on the first anode electrode side overlapping the first electron transport layer being included; the first light-emitting layer being included between the first electron transport layer and the first hole transport layer, the first light-emitting layer and the second light-emitting layer overlapping each other as viewed from the first direction, a first optical filter overlapping the first light-emitting layer and the second light-emitting layer as viewed from the first direction, and located closer to the first direction side than the first light-emitting layer and the second light-emitting layer; and a second optical filter overlapping the first light-emitting layer and the second light-emitting layer as viewed from the second direction, and located closer to the second direction side than the first light-emitting layer and the second light-emitting layer, wherein the first optical filter has an optical characteristic different from an optical characteristic of the second optical filter.

Further, in order to solve the problem described above, a light-emitting device according to an aspect of the disclosure emits light in a first direction and also emits light in a second direction opposite to the first direction, and the light-emitting device includes: a first light-emitting layer configured to emit light of a first color; a second light-emitting layer configured to emit light of a second color different from the first color, a fourth light-emitting layer configured to emit the light of the second color; and a first electrode pair including at least a pair of a first anode electrode and a first cathode electrode, wherein all of the first light-emitting layer, the second light-emitting layer, and the fourth light-emitting layer overlap one another, at least the first light-emitting layer is included between the first electrode pair, the second light-emitting layer is included closer to a light emission side in the first direction than the first light-emitting layer, and the fourth light-emitting layer is included closer to a light emission side in the second direction than the first light-emitting layer.

Advantageous Effects of Disclosure

According to an aspect of the disclosure, there is provided a light-emitting device of double-sided light emission that can reduce a difference in light emission from light emission directions different from each other and includes layering of a plurality of light-emitting layers.

DESCRIPTION OF EMBODIMENTS

First Embodiment

Figure 1:
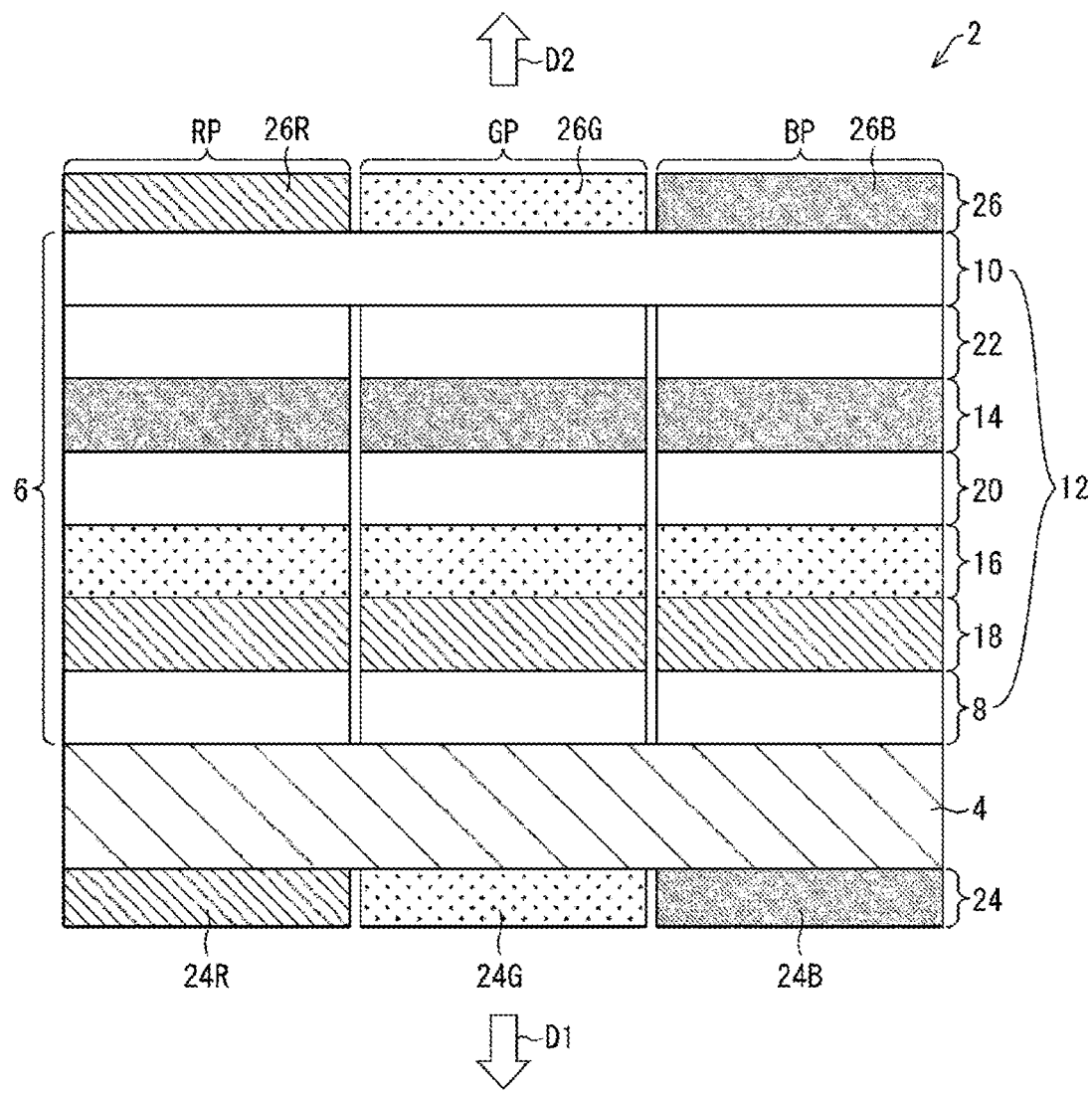
FIG. 1 is a schematic cross-sectional view of a display device according to a first embodiment of the disclosure.

FIG. 1 is a schematic cross-sectional view illustrating a display device 2 according to the present embodiment. As illustrated in FIG. 1, the display device 2 has a structure in which each layer of a light-emitting element layer 6 is layered on a substrate 4. The display device 2 emits light in a first direction D1 illustrated in FIG. 1, and also emits light in a second direction D2 opposite to the first direction D1. In the present embodiment, as illustrated in FIG. 1, both of the first direction D1 and the second direction D2 may be substantially parallel to a normal direction with respect to upper and lower surfaces of the substrate 4. Note that, in the present specification, a direction from the light-emitting element layer 6 to the substrate 4 is indicated as the first direction D1, and a direction from the substrate 4 to the light-emitting element layer 6 is indicated as the second direction D2.

The substrates 4 is a transparent substrate having light-transmitting properties. In the present embodiment, the substrate 4 may be a rigid substrate including a glass substrate and the like, or may be a flexible substrate including a film substrate and the like.

The light-emitting element layer 6 includes an electrode pair 12 as a first electrode pair including, as a pair of electrodes, a cathode electrode 8 as a first cathode electrode and an anode electrode 10 as a first anode electrode. The light-emitting element layer 6 includes, from the anode electrode 10 side between the first electrode pair, a blue light-emitting layer 14 as a first light-emitting layer, a green light-emitting layer 16 as a second light-emitting layer, and a red light-emitting layer 18 as a third light-emitting layer. Further, the light-emitting element layer 6 includes an electron transport layer 20 as a first electron transport layer between the blue light-emitting layer 14 and the green light-emitting layer 16, and includes a hole transport layer 22 between the anode electrode 10 and the blue light-emitting layer 14. In other words, the light-emitting element layer 6 includes, between the electrode pair 12, the electron transport layer 20 on the cathode electrode 8 side, the hole transport layer 22 on the anode electrode 10 side, and the blue light-emitting layer 14 between the electron transport layer 20 and the hole transport layer 22. Each layer of the light-emitting element layer 6 has light-transmitting properties.

An electron injected from the cathode electrode 8 and a positive hole injected from the anode electrode 10 recombine in each of the light-emitting layers, and thus the light-emitting element layer 6 emits light from the light-emitting layer. Specifically, blue light as a first color is emitted from the blue light-emitting layer 14, green light as a second color is emitted from the green light-emitting layer 16, and red light as a third color is emitted from the red light-emitting layer 18.

The blue light-emitting layer 14, the green light-emitting layer 16, and the red light-emitting layer 18 include, for example, a quantum dot material as a light-emitting material. In this case, recombination of the electron and the positive hole occurs in a quantum dot included in each of the light-emitting layers to emit light of a color from the corresponding light-emitting layer. The quantum dot included in each of the light-emitting layers may have, for example, a core/shell structure, and, in this case, a wavelength of the light emitted from the quantum dot can be controlled by controlling a particle diameter of the core.

In the present embodiment, the blue light-emitting layer 14, the green light-emitting layer 16, and the red light-emitting layer 18 overlap each other as viewed from the first direction D1. Note that, in the present embodiment, a state where a plurality of members "overlap" each other indicates a state where at least parts of the plurality of members overlap each other as viewed from a certain direction.

Figure 2:
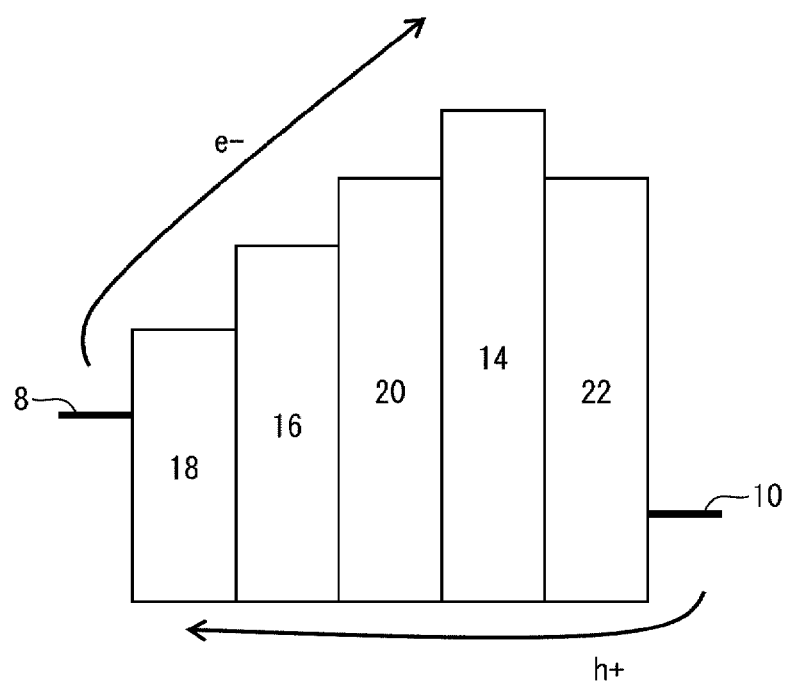
FIG. 2 is an energy band diagram illustrating an example of a Fermi level or a band gap of each layer in a light-emitting element layer of the display device according to the first embodiment of the disclosure.

FIG. 2 is an energy band diagram illustrating an example of a Fermi level or a band gap of each layer in the light-emitting element layer according to the present embodiment.

Note that the energy band diagram of the present specification illustrates the energy level of each layer with reference to a vacuum level. Further, the energy band diagram of the present specification illustrates a Fermi level or a band gap of a member corresponding to a provided member number. For example, the Fermi level is indicated for the anode electrode and the cathode electrode, and the band gap from an electron affinity to an ionization potential is indicated for the hole transport layer, the light-emitting layer, and the electron transport layer.

In general, the shorter wavelength of the light emitted from the light-emitting layer increases the band gap of the light-emitting layer. Further, in the quantum dot material, the shorter wavelength of the emitted light reduces the electron affinity, whereas the ionization potential tends to be less likely to fluctuate greatly regardless of the wavelength of the emitted light.

Note that, in the present embodiment, for example, materials of the electron transport layer 20 and the hole transport layer 22 may be determined such that both of the electron affinities of the electron transport layer 20 and the hole transport layer 22 have a value intermediate between the electron affinities of the blue light-emitting layer 14 and the green light-emitting layer 16. Further, in the present embodiment, for example, materials of the electron transport layer 20 and the hole transport layer 22 may be determined such that both of the electron affinities of the electron transport layer 20 and the hole transport layer 22 are substantially the same as the ionization potential of each of the light-emitting layers.

In this case, as illustrated in FIG. 2, in the present embodiment, the electron affinity of each layer from the red light-emitting layer 18 to the blue light-emitting layer 14 gradually decreases. Thus, when the electrode pair 12 is driven, the electron injected from the cathode electrode 8 into the red light-emitting layer 18 is relatively easily and sequentially transported to each layer to the blue light-emitting layer 14 as indicated by an arrow e-in FIG. 2.

Further, as illustrated in FIG. 2, in the present embodiment, the ionization potential of each layer from the hole transport layer 22 to the red light-emitting layer 18 does not fluctuate greatly. Thus, when the electrode pair 12 is driven, the positive hole injected from the anode electrode 10 into the hole transport layer 22 is relatively easily and sequentially transported to each layer to the red light-emitting layer 18 as indicated by an arrow h+ in FIG. 2.

Thus, when the electrode pair 12 is driven, the electron and the positive hole are transported to each of the blue light-emitting layer 14, the green light-emitting layer 16, and the red light-emitting layer 18. Therefore, each of the blue light-emitting layer 14, the green light-emitting layer 16, and the red light-emitting layer 18 emits light by injection-type electroluminescence. In other words, each of the blue light-emitting layer 14, the green light-emitting layer 16, and the red light-emitting layer 18 emits light in an electroluminescence mode.

Thus, the blue light from the blue light-emitting layer 14, the green light from the green light-emitting layer 16, and the red light from the red light-emitting layer 18 are emitted from the light-emitting element layer 6, and, as a result, white light is emitted from the light-emitting element layer 6. The light from each of the light-emitting layers is emitted in both of the direction to the cathode electrode 8, that is, the first direction D1, and the direction to the anode electrode 10, that is, the second direction D2.

The display device 2 according to the present embodiment includes a plurality of subpixels that emit light having wavelengths different from each other. In particular, in the present embodiment, the display device 2 includes a blue subpixel BP, a green subpixel GP, and a red subpixel RP illustrated in FIG. 1. A configuration of each layer in each of the subpixels will be described in detail with reference to FIG. 3.

Figure 3:
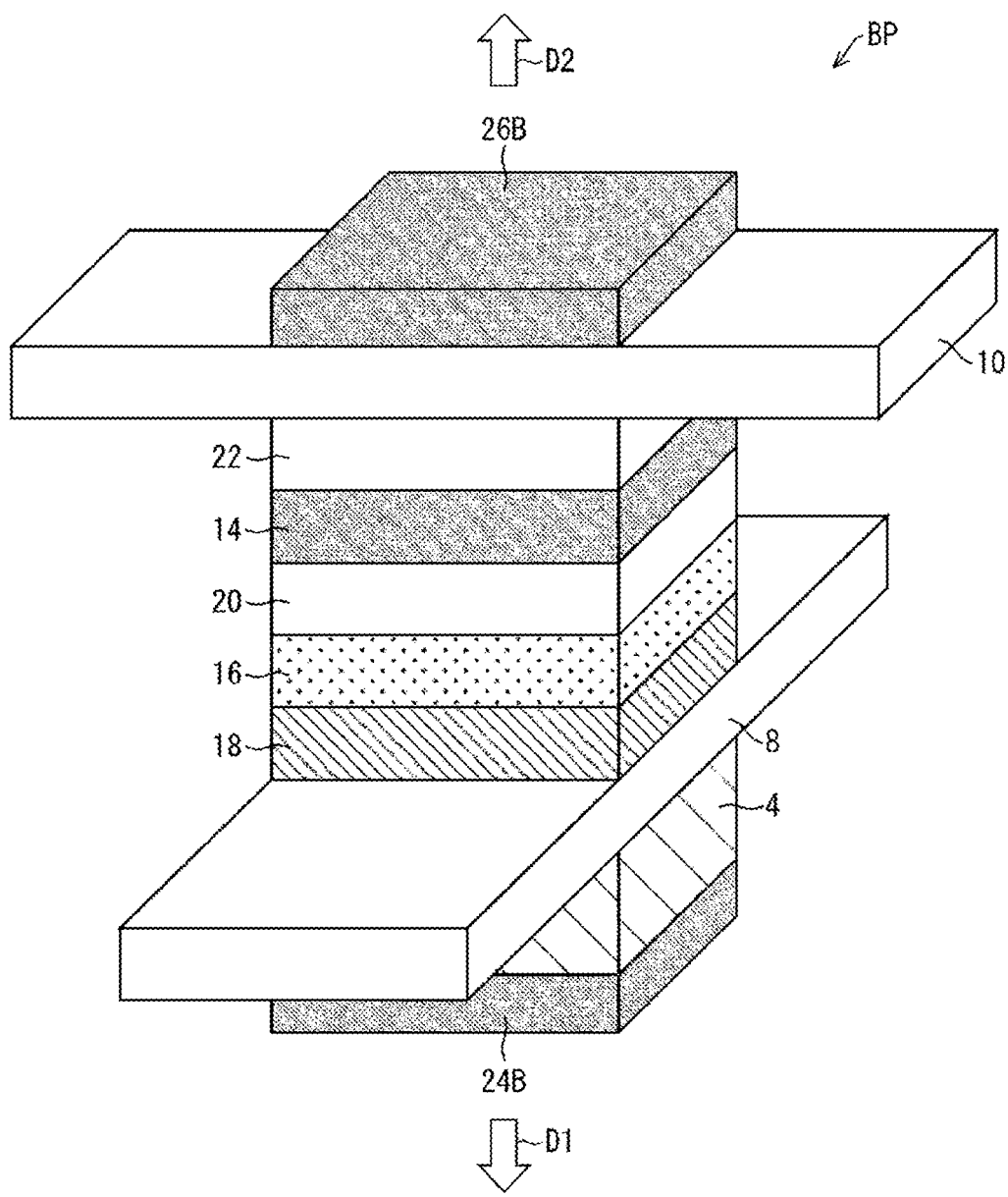
FIG. 3 is a schematic perspective view of a blue subpixel of the display device according to the first embodiment of the disclosure

FIG. 3 is a schematic perspective view illustrating one blue subpixel BP of the plurality of subpixels. FIG. 3 extracts and illustrates only each layer in the blue subpixel BP except for the electrode pair 12. In other words, FIG. 3 illustrates the electrode pair 12 in the subpixel adjacent to the blue subpixel BP.

In the present embodiment, the display device 2 is a display device of a passive matrix method. Specifically, for example, the light-emitting element layer 6 includes a plurality of the cathode electrodes 8 and a plurality of anode electrodes 10. Each of the cathode electrodes 8 and each of the anode electrodes 10 are formed so as to be substantially orthogonal to each other in a plan view. In FIG. 1, each of the cathode electrodes 8 is illustrated so as to extend in a depth direction in FIG. 1, and each of the anode electrodes 10 is illustrated so as to extend in a left-right direction in FIG. 1.

Further, each of the subpixels of the display device 2 is formed in each position in which each of the cathode electrodes 8 and each of the anode electrodes 10 intersect in the plan view. By individually applying a voltage to any of each of the cathode electrodes 8 and each of the anode electrodes 10, the display device 2 can drive the subpixel at the intersection point between the cathode electrode 8 and the anode electrode 10 to which the voltage is applied.

Furthermore, the display device 2 includes a first optical filter on the first direction D1 side of the substrate 4, and includes a second optical filter on the second direction D2 side of the light-emitting element layer 6. In the present embodiment, each of the first optical filter and the second optical filter includes at least two regions having different colors.

In other words, the display device 2 includes a first color filter 24 as the first optical filter on the first direction D1 side of the substrate 4, and includes a second color filter 26 as the second optical filter on the second direction D2 side of the light-emitting element layer 6. The first color filter 24 and the second color filter 26 each include color filters of a plurality of colors.

In particular, the first color filter 24 overlaps the blue light-emitting layer 14, the green light-emitting layer 16, and the red light-emitting layer 18 as viewed from the first direction D1, and is also disposed closer to the first direction D1 side than the blue light-emitting layer 14, the green light-emitting layer 16, and the red light-emitting layer 18. Further, the second color filter 26 overlaps the blue light-emitting layer 14, the green light-emitting layer 16, and the red light-emitting layer 18 as viewed from the second direction D2, and is also disposed closer to the second direction D2 side than the blue light-emitting layer 14, the green light-emitting layer 16, and the red light-emitting layer 18.

In the present embodiment, the first color filter 24 includes a first blue color filter 24B that transmits the blue light, a first green color filter 24G that transmits the green light, and a first red color filter 24R that transmits the red light. Similarly, the second color filter 26 includes a second blue color filter 26B that transmits the blue light, a second green color filter 26G that transmits the green light, and a second red color filter 26R that transmits the red light.

The color filters of the corresponding colors included in the first color filter 24 and the second color filter 26 are each formed in a position corresponding to each of the subpixels described above in the plan view. Thus, the blue subpixel BP is formed in a position in which the first blue color filter 24B and the second blue color filter 26B are formed in the plan view. Further, the green subpixel GP is formed in a position in which the first green color filter 24G and the second green color filter 26G are formed in the plan view. Similarly, the red subpixel RP is formed in a position in which the first red color filter 24R and the second red color filter 26R are formed in the plan view.

The white light emitted in the first direction D1 of the white light from the light-emitting element layer 6 is transmitted through any color filter of the first color filter 24. Further, the white light emitted in the second direction D2 of the white light from the light-emitting element layer 6 is transmitted through any color filter of the second color filter 26. Therefore, the blue light is emitted from the blue subpixel BP, the green light is emitted from the green subpixel GP, and the red light is emitted from the red subpixel RP. The display device 2 achieves color display by controlling drive of each of the subpixels.

In the present embodiment, each layer from the red light-emitting layer 18 to the hole transport layer 22 may be individually formed on a subpixel-by-subpixel basis. In this way, when a certain subpixel is driven, crosstalk with an adjacent subpixel is reduced. However, the present embodiment is not limited thereto, and each layer from the red light-emitting layer 18 to the hole transport layer 22 may be formed in common to the plurality of subpixels. In this way, each layer from the red light-emitting layer 18 to the hole transport layer 22 is more easily formed.

In the present embodiment, the first color filter 24 and the second color filter 26 have optical characteristics different from each other. In particular, the first color filter 24 and the second color filter 26 have transmittances of light different from each other with respect to the blue light, the green light, and the red light.

Specifically, the first blue color filter 24B of the first color filter 24 and the second blue color filter 26B of the second color filter 26 have different transmittances of the blue light. Further, the first green color filter 24G and the second green color filter 26G have different transmittances of the green light. In addition, the first red color filter 24R and the second red color filter 26R have different transmittances of the red light.

In the display device 2 according to the present embodiment, emission light in the first direction D1 from the light-emitting element layer 6 and emission light in the second direction D2 from the light-emitting element layer 6 are respectively transmitted through the first color filter 24 and the second color filter 26 having the optical characteristics different from each other. This achieves a configuration that may improve an optical difference between the emission light in the first direction D1 from the light-emitting element layer 6 and the emission light in the second direction D2 from the light-emitting element layer 6.

For example, in the blue subpixel BP, a distance from the blue light-emitting layer 14 to the first color filter 24 is longer than a distance from the blue light-emitting layer 14 to the second color filter 26. In addition, in particular, when the quantum dot material is used for each of the light-emitting layers, the blue light emitted in the first direction D1 from the blue light-emitting layer 14 may be absorbed in the green light-emitting layer 16 and the red light-emitting layer 18. Thus, the blue light from the blue subpixel BP may have intensity different when the blue light is visually recognized from the first direction D1 and when the blue light is visually recognized from the second direction D2.

In other words, for example, even when light emission in the first direction D1 is defined to be white, light emission in the second direction D2 may be a color of a point on a chromaticity diagram different from that of the light emission in the first direction D1, and may have a different white balance.

In the present embodiment, for example, the transmittance of the blue light of the second blue color filter 26B may be lower than the transmittance of the blue light of the first blue color filter 24B. This can reduce a difference between the intensity of the blue light emitted from the blue subpixel BP in the first direction D1 and the intensity of the blue light emitted from the blue subpixel BP in the second direction D2.

The display device 2 according to the present embodiment can reduce a difference in tinge when the light is visually recognized from each of the first direction D1 and the second direction D2 different from each other, and can improve display quality in both of the directions.

Note that, in the present embodiment, the transmittances of the first color filter 24 and the second color filter 26 may not be different with respect to all of the three colors described above in order to obtain the advantageous effect described above. In order to obtain the advantageous effect described above, a ratio of the transmittance in each luminescent color wavelength may be adjusted to reduce a difference in tinge. In other words, in the present embodiment, color filters of some colors may be made common between the first color filter 24 and the second color filter 26, and may have the same transmittance. The same also applies to each subsequent embodiment.

The display device 2 according to the present embodiment includes the green light-emitting layer 16 and the red light-emitting layer 18 that are in contact with each other. Thus, the green light-emitting layer 16 and the red light-emitting layer 18 are close to each other, and a difference is less likely to be occur in the intensity of the green light from the green light-emitting layer 16 and the red light from the red light-emitting layer 18 between the first direction D1 and the second direction D2. Therefore, design of the first color filter 24 and the second color filter 26 is more facilitated.

Note that, in the present embodiment, a device that includes a plurality of blue subpixels BP, the green subpixels GP, and the red subpixels RP and enables color display is used as an example of the display device 2. However, no such limitation is intended, and each configuration in the present embodiment may be applied to a light-emitting device including a single electrode pair 12.

Modified Example

Figure 4:
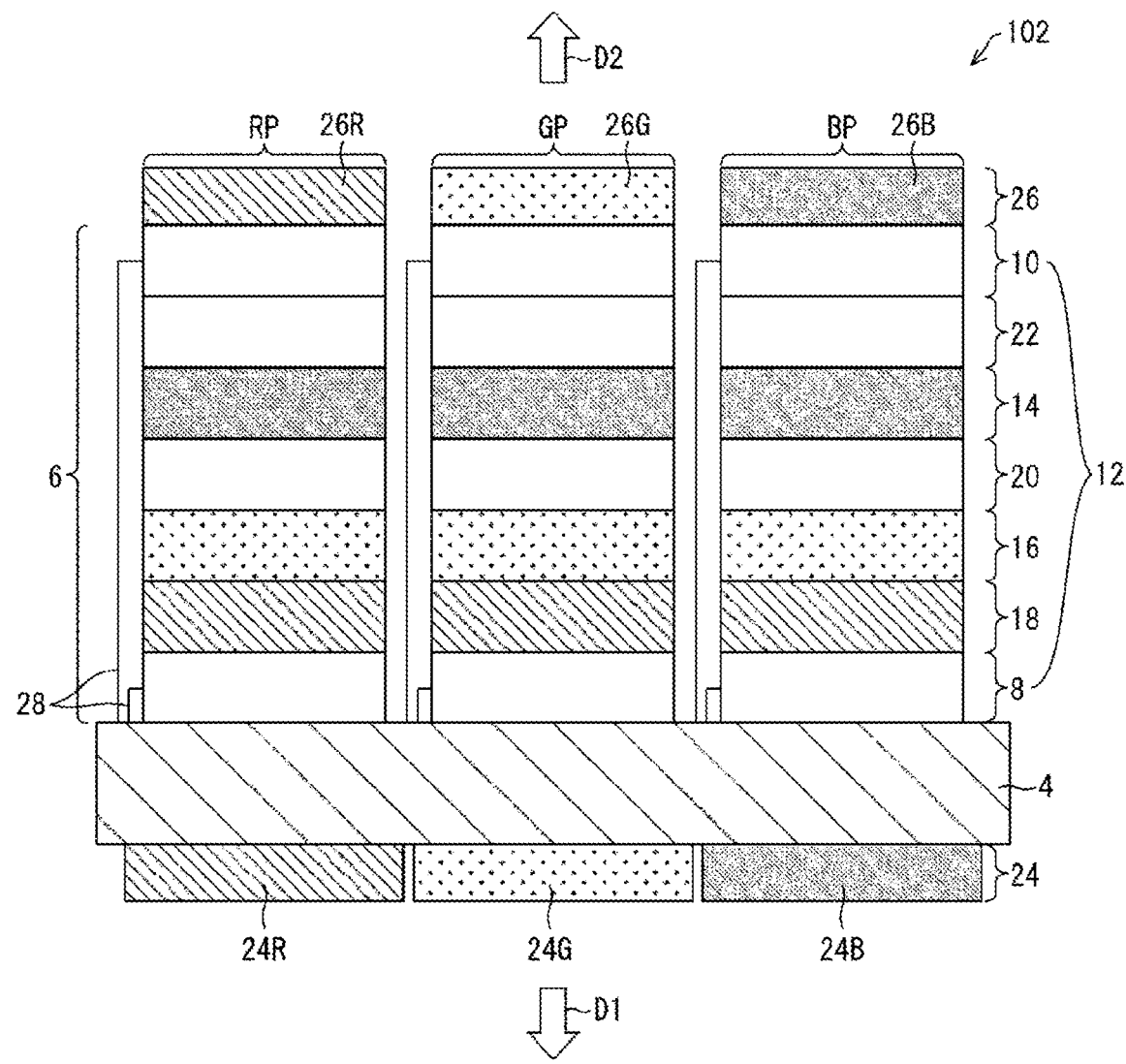
FIG. 4 is a schematic cross-sectional view of a display device according to a modified example of the first embodiment of the disclosure.

FIG. 4 is a schematic cross-sectional view illustrating a display device 102 according to a modified example of the present embodiment.

In the display device 102 according to the present modified example, each of the cathode electrode 8 and the anode electrode 10 is formed on a subpixel-by-subpixel basis. In other words, the display device 102 according to the present modified example includes the electrode pair 12 on a subpixel-by-subpixel basis.

Further, the substrate 4 of the display device 102 according to the present modified example includes a TFT (not illustrated) on a subpixel-by-subpixel basis, and can individually drive each electrode pair 12 via a wiring line 28 connected to each of the cathode electrode 8 and the anode electrode 10.

Except for the points described above, the display device 102 according to the present modified example has the same configuration as that of the display device 2 according to the present embodiment.

Similarly to the display device 2 according to the present embodiment, the display device 102 according to the present modified example can have a configuration that can reduce a difference in tinge when visually recognized from each of the first direction D1 and the second direction D2 different from each other. Furthermore, the display device 102 according to the present modified example can provide a display device of an active matrix method, and can perform high-speed drive of each of the subpixels.

One of the cathode electrode 8 and the anode electrode 10 of the display device 102 according to the present modified example may be formed in common to each of the subpixels. In this case, each of the subpixels may be driven by applying a constant voltage to the electrodes formed in common to each of the subpixels, and driving the electrodes individually formed in each of the subpixels.

Second Embodiment

Figure 5:
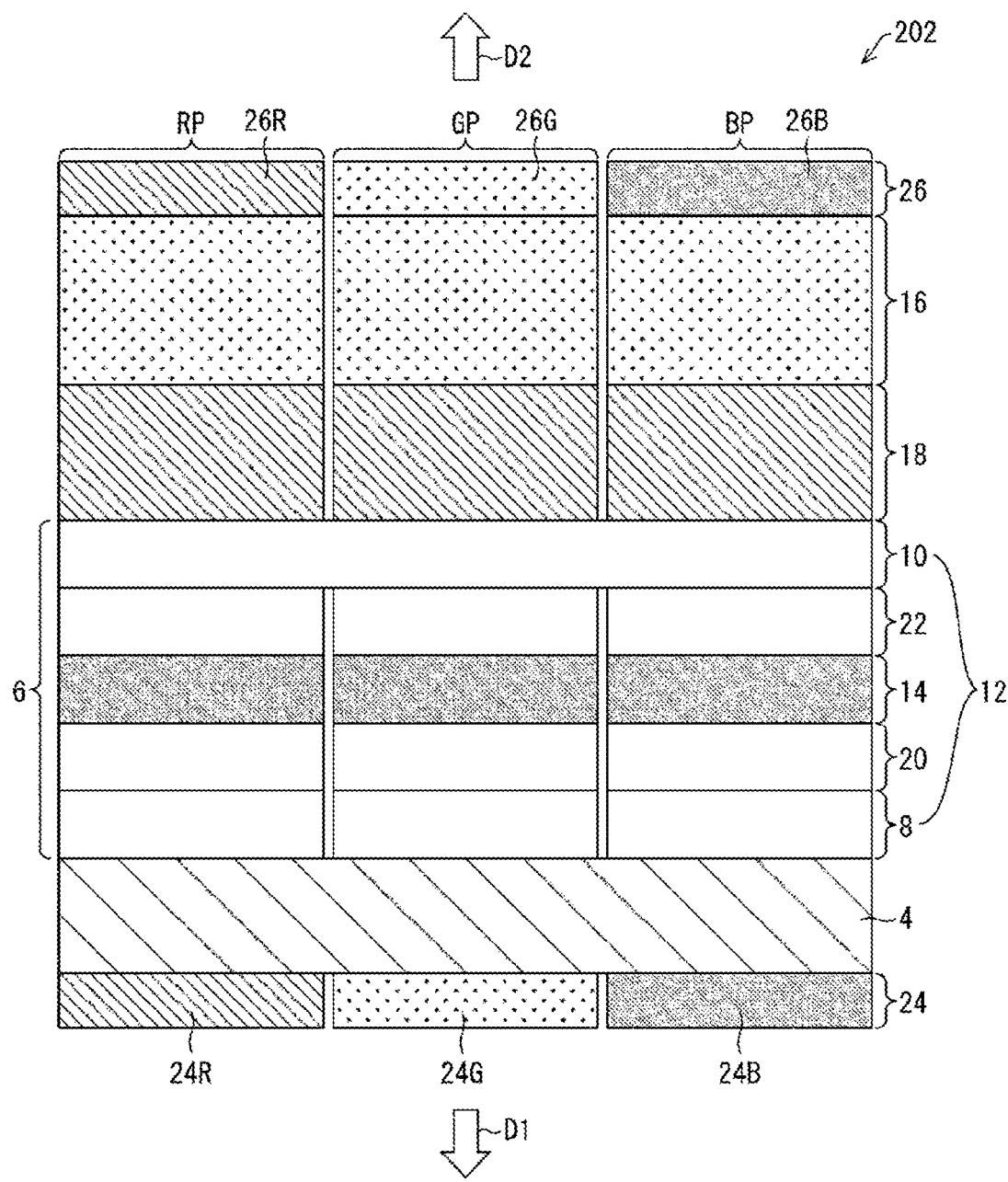
FIG. 5 is a schematic cross-sectional view of a display device according to a second embodiment of the disclosure.
Figure 6:
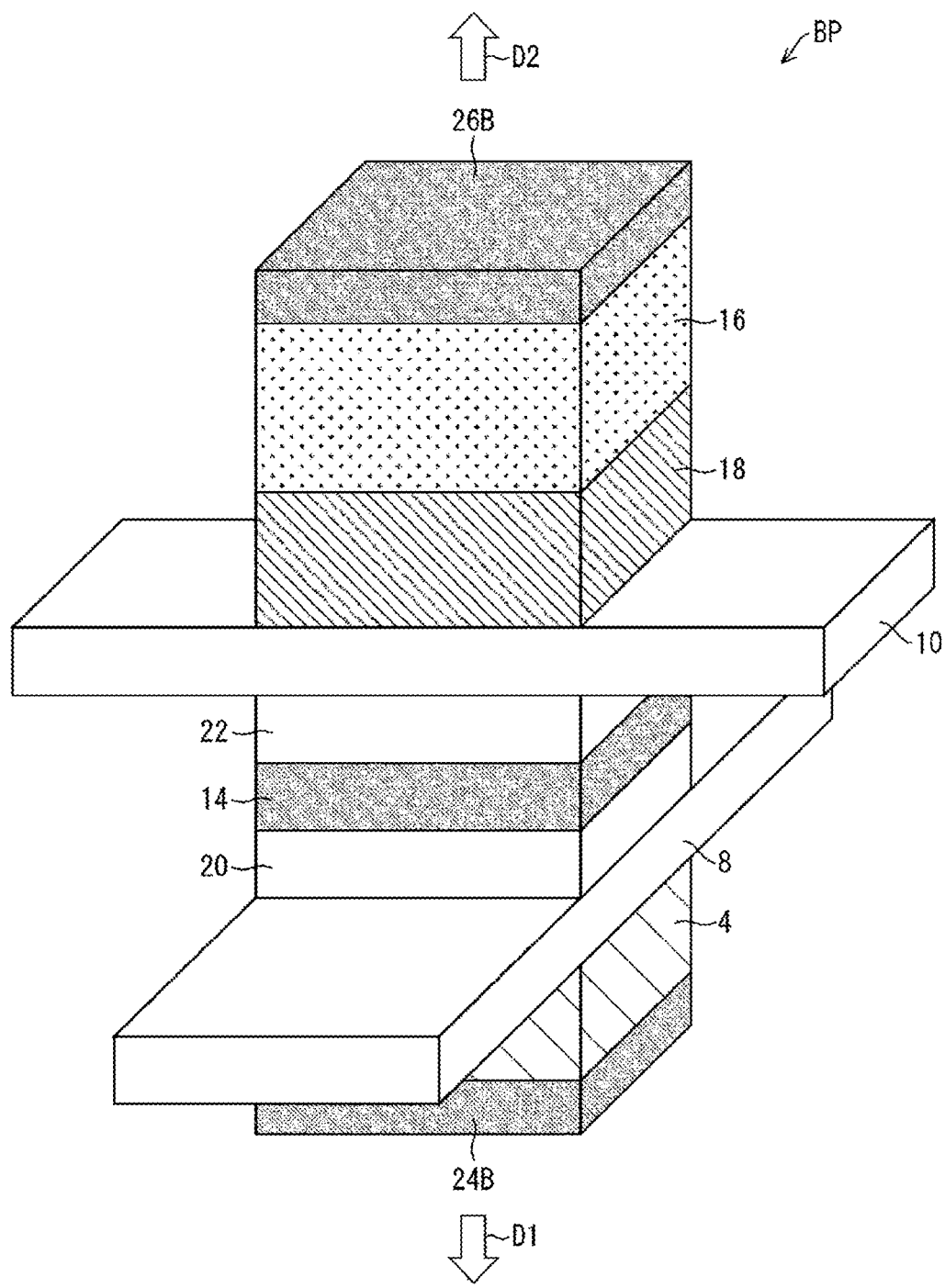
FIG. 6 is a schematic perspective view of a blue subpixel of the display device according to the second embodiment of the disclosure.

FIG. 5 is a schematic cross-sectional view illustrating a display device 202 according to the present embodiment. FIG. 6 is a schematic perspective view illustrating a blue subpixel BP of the display device 202 according to the present embodiment. Note that, in the present specification, each member having the same function is denoted by the same name and the same reference numeral, and the same description will not be repeated as long as there is no difference in configurations.

As illustrated in FIG. 5, the display device 202 includes a light-emitting element layer 6 on a substrate 4. Note that, in the present embodiment, the light-emitting element layer 6 includes a cathode electrode 8, an electron transport layer 20, a blue light-emitting layer 14, a hole transport layer 22, and an anode electrode 10 that are layered from the substrate 4 side. Further, the display device 202 includes a red light-emitting layer 18 and a green light-emitting layer 16 on the light-emitting element layer 6 from the light-emitting element layer 6 side.

Similarly to the display device 2 according to the previous embodiment, the display device 202 includes a first color filter 24 on the first direction D1 side of the substrate 4. On the other hand, the display device 202 includes a second color filter 26 on the second direction D2 side of the green light-emitting layer 16. Note that the present embodiment is not different from the previous embodiment in a point that the second color filter 26 is disposed closer to the second direction D2 side than the blue light-emitting layer 14, the green light-emitting layer 16, and the red light-emitting layer 18.

Also in the present embodiment, the first color filter 24 overlaps the blue light-emitting layer 14, the green light-emitting layer 16, and the red light-emitting layer 18 as viewed from the first direction D1. Further, the second color filter 26 overlaps the blue light-emitting layer 14, the green light-emitting layer 16, and the red light-emitting layer 18 as viewed from the second direction D2.

In the present embodiment, only the blue light-emitting layer 14 is formed as a light-emitting layer between an electrode pair 12. Thus, by recombination of the electron injected from the cathode electrode 8 and the positive hole injected from the anode electrode 10, only the blue light is emitted from the blue light-emitting layer 14 from the light-emitting element layer 6.

In addition, in the present embodiment, the green light-emitting layer 16 absorbs light, such as the blue light, having a wavelength shorter than that of light emitted by itself, that is, the green light, converts the absorbed light, and emits the green light. Similarly, the red light-emitting layer 18 absorbs light, such as the blue light and the green light, having a wavelength shorter than that of light emitted by itself, that is, the red light, converts the absorbed light, and emits the red light. The green light-emitting layer 16 and the red light-emitting layer 18 having the configuration described above are easily achieved by the green light-emitting layer 16 and the red light-emitting layer 18 including the quantum dot material as the light-emitting material.

In the present embodiment, the green light-emitting layer 16 and the red light-emitting layer 18 emit light by photoexcitation by the blue light from the light-emitting element layer 6. In other words, in the present embodiment, the green light-emitting layer 16 and the red light-emitting layer 18 emit light in a photoluminescence mode. Note that each of the green light-emitting layer 16 and the red light-emitting layer 18 according to the present embodiment may have a film thickness thicker than that of each of the green light-emitting layer 16 and the red light-emitting layer 18 according to the previous embodiment. In this way, the photoexcitation in each of the green light-emitting layer 16 and the red light-emitting layer 18 is more efficiently performed.

Thus, the blue light is emitted from the blue light-emitting layer 14, the green light is emitted from the green light-emitting layer 16, and the red light is emitted from the red light-emitting layer 18 in the first direction D1 and the second direction D2. As a result, similarly to the previous embodiment, also in the present embodiment, the white light is emitted toward the first color filter 24 and the second color filter 26, and the white light is transmitted through the first color filter 24 and the second color filter 26. Thus, similarly to the previous embodiment, also in the present embodiment, the blue light is emitted from the blue subpixel BP, the green light is emitted from a green subpixel GP, and the red light is emitted from a red subpixel RP.

Here, in the present embodiment, in particular, for the blue light from the blue light-emitting layer 14, the light emitted in the second direction D2 is weaker than the light emitted in the first direction D1. The reason is that the blue light is absorbed in the green light-emitting layer 16 and the red light-emitting layer 18.

The green light from the green light-emitting layer 16 and the red light from the red light-emitting layer 18 that are generated by excitation by the blue light from the blue light-emitting layer 14 are emitted at the same intensity in the first direction D1 and the second direction D2. However, similarly to the previous embodiment, a distance from each of the light-emitting layers to the first color filter 24 and a distance from each of the light-emitting layers to the second color filter 26 are different. Thus, the white light in the first direction D1 and the white light in the second direction D2 are the white light in points different from each other on the chromaticity diagram, and have a different white balance.

Similarly to the display device 2 according to the previous embodiment, the display device 202 according to the present embodiment can have a configuration that can reduce a difference in tinge when visually recognized from each of the first direction D1 and the second direction D2 different from each other. In addition, the display device 202 according to the present embodiment causes only the blue light-emitting layer 14 to emit light by the injection-type electroluminescence, and causes the green light-emitting layer 16 and the red light-emitting layer 18 to emit light by the photoexcitation. Thus, in the present embodiment, design of a level of each layer of the light-emitting element layer 6 may be set as optimal design for causing only the blue light-emitting layer 14 to emit light. Thus, design of the light-emitting element layer 6 is facilitated. Furthermore, the display device 202 according to the present embodiment is also easily manufactured from a perspective of not requiring strict design of an interface level and the like in a layer except for the blue light-emitting layer 14 into which a charge is injected.

Note that an example is given that the display device 202 according to the present embodiment includes the green light-emitting layer 16 and the red light-emitting layer 18 between the anode electrode 10 being one of the electrodes of the electrode pair 12, and the second color filter 26, which is not limited thereto. For example, the display device 202 according to the present embodiment may include the green light-emitting layer 16 and the red light-emitting layer 18 between the cathode electrode 8 being the other electrode with respect to the anode electrode 10, and the first color filter 24.

Modified Example

Figure 7:
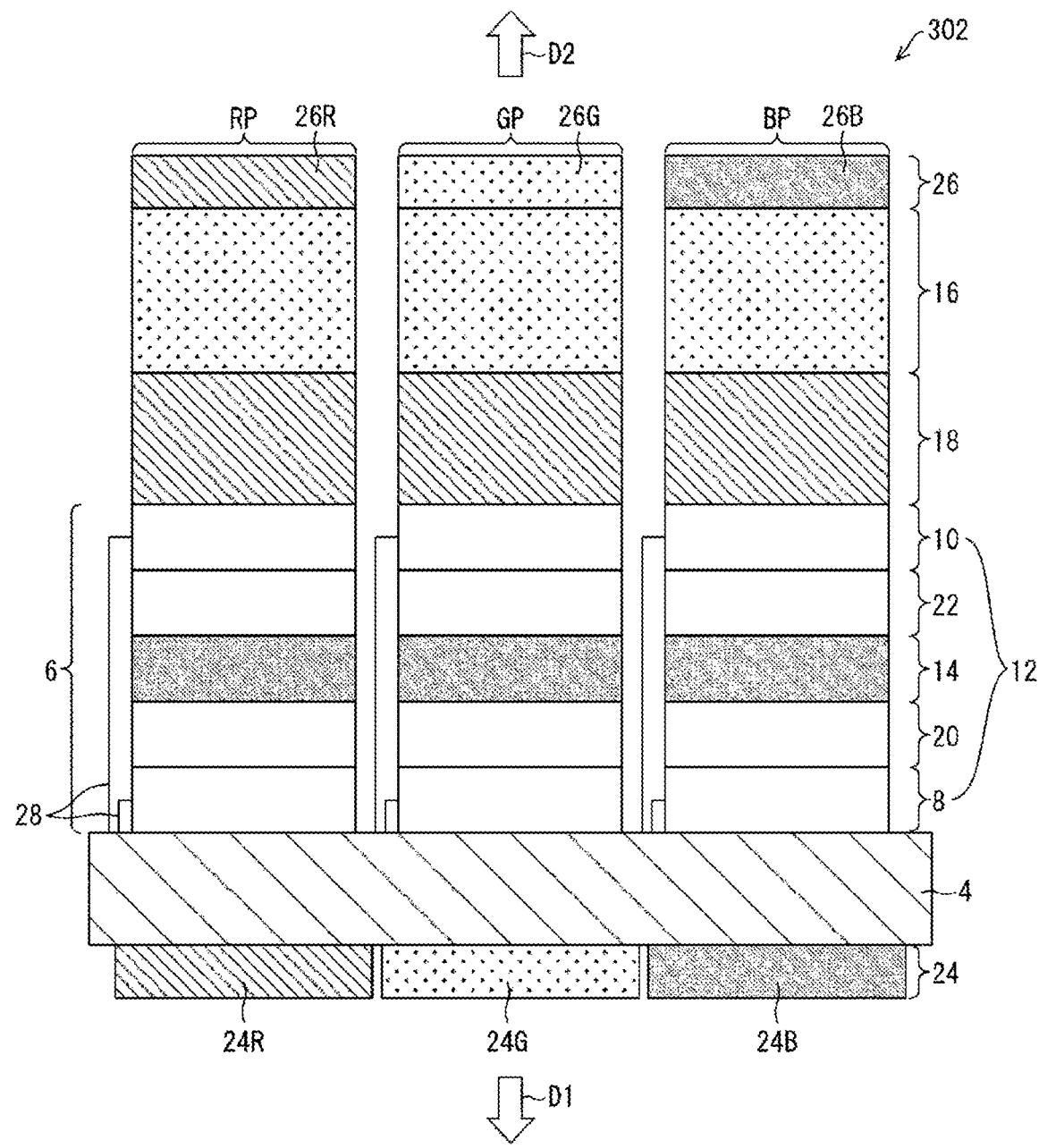
FIG. 7 is a schematic cross-sectional view of a display device according to a modified example of the second embodiment of the disclosure.

FIG. 7 is a schematic cross-sectional view illustrating a display device 302 according to a modified example of the present embodiment.

In the display device 302 according to the present modified example, similarly to the display device 102 according to the modified example of the previous embodiment, each of the cathode electrode 8 and the anode electrode 10 is formed on a subpixel-by-subpixel basis, and the substrate 4 can individually drive each electrode pair 12 via a wiring line 28.

Except for the points described above, the display device 302 according to the present modified example has the same configuration as that of the display device 202 according to the present embodiment.

Similarly to the display device 202 according to the present embodiment, the display device 302 according to the present modified example can have a configuration that can reduce a difference in tinge when visually recognized from each of the first direction D1 and the second direction D2 different from each other. Furthermore, the display device 302 according to the present modified example can provide a display device of an active matrix method, and can perform high-speed drive of each of the subpixels.

Third Embodiment

Figure 8:
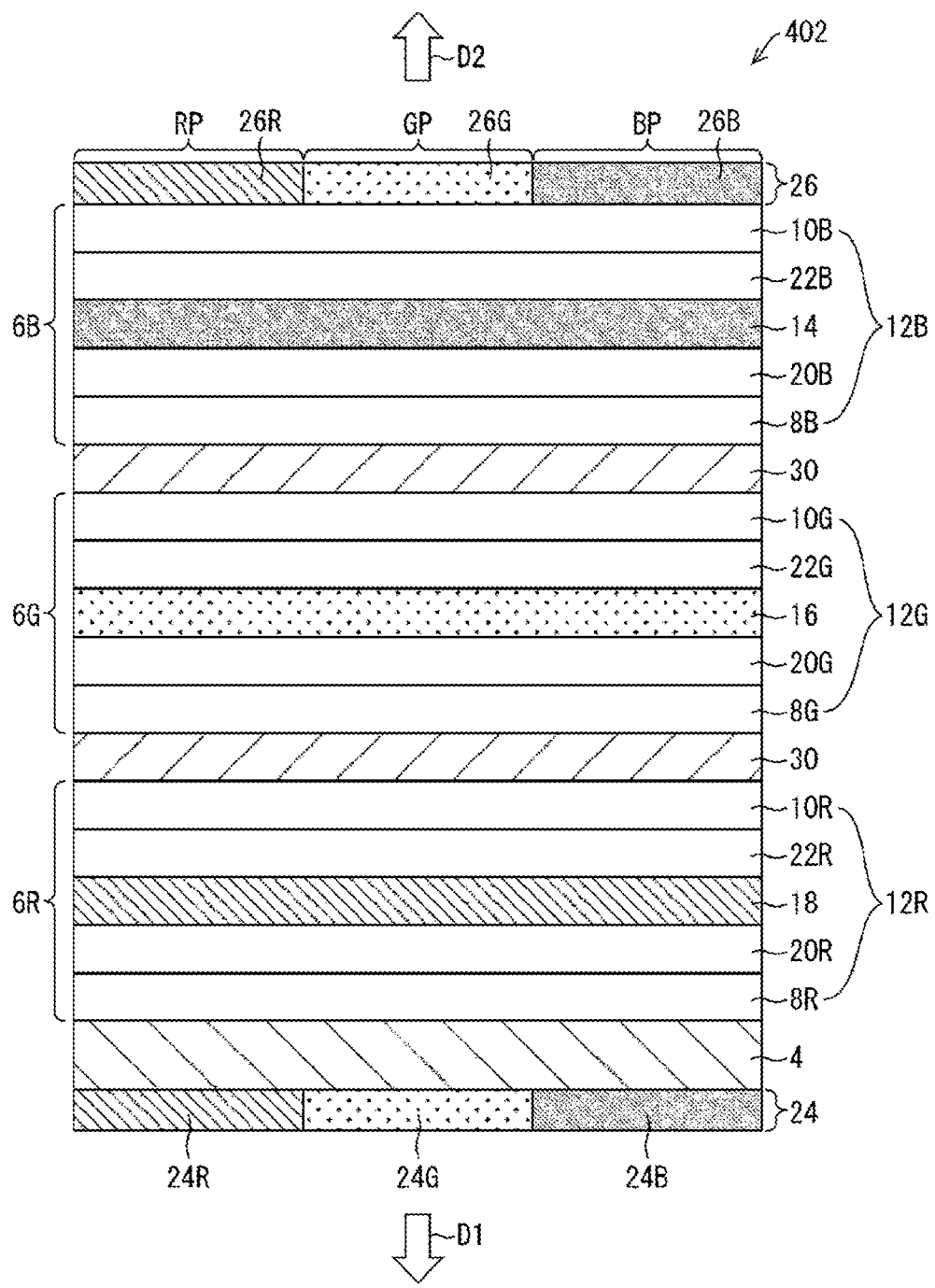
FIG. 8 is a schematic cross-sectional view of a display device according to a third embodiment of the disclosure.
Figure 9:
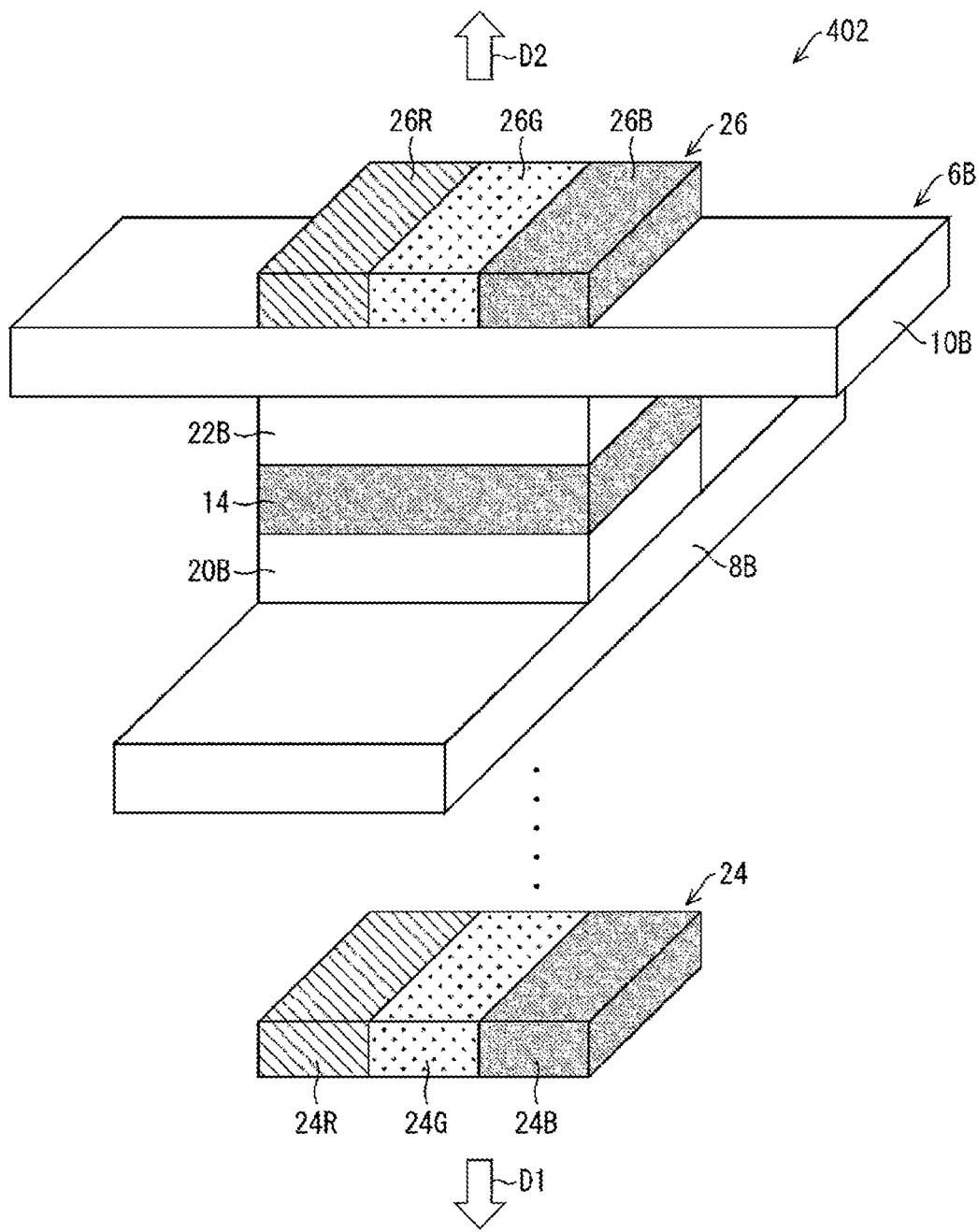
FIG. 9 is a schematic perspective view of the display device according to the third embodiment of the disclosure.

FIG. 8 is a schematic cross-sectional view illustrating a display device 402 according to the present embodiment. FIG. 9 is a schematic perspective view illustrating the display device 402 according to the present embodiment. Note that, for simplifying illustration, FIG. 9 extracts and illustrates only a blue light-emitting element layer 6B, a first color filter 24, and a second color filter 26 of members described below.

As illustrated in FIG. 8, the display device 402 according to the present embodiment includes a red light-emitting element layer 6R, a green light-emitting element layer 6G, and the blue light-emitting element layer 6B from the substrate 4 side on the substrate 4.

The blue light-emitting element layer 6B includes an electrode pair 12B as a first electrode pair including a cathode electrode 8B as a first cathode electrode and an anode electrode 10B as a first anode electrode. An electron transport layer 20B as a first electron transport layer, a blue light-emitting layer 14 as a first light-emitting layer, and a hole transport layer 22B as a first hole transport layer are formed between the electrode pair 12B from the cathode electrode 8B side.

A green light-emitting element layer 6G includes an electrode pair 12G as a second electrode pair including a cathode electrode 8G as a second cathode electrode and an anode electrode 10G as a second anode electrode. An electron transport layer 20G as a second electron transport layer, a green light-emitting layer 16 as a second light-emitting layer, and a hole transport layer 22G as a second hole transport layer are formed between the electrode pair 12G from the cathode electrode 8G side.

A red light-emitting element layer 6R includes an electrode pair 12R as a third electrode pair including a cathode electrode 8R as a third cathode electrode and an anode electrode 10R as a third anode electrode. An electron transport layer 20R as a third electron transport layer, a red light-emitting layer 18 as a third light-emitting layer, and a hole transport layer 22R as a third hole transport layer are formed between the electrode pair 12R from the cathode electrode 8R side.

In the present embodiment, the display device 402 may individually drive the electrode pair 12B, the electrode pair 12G, and the electrode pair 12R.

By driving the electrode pair 12B, an electron from the cathode electrode 8B is transported to the blue light-emitting layer 14 via the electron transport layer 20B, and a positive hole from the anode electrode 10B is transported to the blue light-emitting layer 14 via the hole transport layer 22B. In the blue light-emitting layer 14, the electron and the positive hole recombine to emit the blue light from the blue light-emitting layer 14.

Similarly, by driving the electrode pair 12G, an electron from the cathode electrode 8G is transported to the green light-emitting layer 16 via the electron transport layer 20G, and a positive hole from the anode electrode 10G is transported to the green light-emitting layer 16 via the hole transport layer 22G. In the green light-emitting layer 16, the electron and the positive hole recombine to emit the green light from the green light-emitting layer 16.

Furthermore, by driving the electrode pair 12R, an electron from the cathode electrode 8R is transported to the red light-emitting layer 18 via the electron transport layer 20R, and a positive hole from the anode electrode 10R is transported to the red light-emitting layer 18 via the hole transport layer 22R. In the red light-emitting layer 18, the electron and the positive hole recombine to emit the red light from the red light-emitting layer 18.

In other words, in the present embodiment, the blue light-emitting layer 14, the green light-emitting layer 16, and the red light-emitting layer 18 emit light by recombination of the electron and the positive hole from the different electrode pairs. In other words, in the present embodiment, the blue light-emitting layer 14, the green light-emitting layer 16, and the red light-emitting layer 18 each emit light by the injection-type electroluminescence.

The cathode electrode 8B, the cathode electrode 8G, and the cathode electrode 8R may be the same as the cathode electrode 8 according to each of the embodiments described above, and the anode electrode 10B, the anode electrode 10G, and the anode electrode 10R may be the same as the anode electrode 10 according to each of the embodiments described above. Further, each of the electron transport layer 20B and the hole transport layer 22B may be the same as the electron transport layer 20 and the hole transport layer 22 according to each of the embodiments described above.

In the present embodiment, the electron transport layer 20G and the hole transport layer 22G may include an appropriate material for causing the green light-emitting layer 16 to emit light. Further, the electron transport layer 20R and the hole transport layer 22R may include an appropriate material for causing the red light-emitting layer 18 to emit light.

An insulating layer 30 is formed between the blue light-emitting element layer 6B and the green light-emitting element layer 6G and between the green light-emitting element layer 6G and the red light-emitting element layer 6R. Thus, the cathode electrode 8B and the anode electrode 10G are electrically insulated, and the cathode electrode 8G and the anode electrode 10R are electrically insulated.

Similarly to the display device according to each of the embodiments described above, the display device 402 includes the first color filter 24 on the first direction D1 side of a substrate 4. On the other hand, the display device 402 includes the second color filter 26 on the second direction D2 side of the blue light-emitting element layer 6B. Note that, in the present embodiment, the second direction D2 is set as a direction from the substrate 4 to the red light-emitting element layer 6R, the green light-emitting element layer 6G, and the blue light-emitting element layer 6B. Note that the present embodiment is not different from each of the embodiments described above in a point that the second color filter 26 is disposed closer to the second direction D2 side than the blue light-emitting layer 14, the green light-emitting layer 16, and the red light-emitting layer 18.

In the present embodiment, the light-emitting element layers that emit corresponding colors can be individually driven. Thus, the first color filter 24 and the second color filter 26 are not always irradiated with the white light. For example, in the present embodiment, when only the blue light-emitting element layer 6B is driven, the first color filter 24 and the second color filter 26 are irradiated with only the blue light. However, the blue light is transmitted through only the first blue color filter 24B and the second blue color filter 26B. The same also applies to the green light and the red light.

Therefore, the display device 402 includes a blue subpixel BP in a position in which the first blue color filter 24B and the second blue color filter 26B are formed in the plan view. Similarly, the display device 402 includes a green subpixel GP in a position in which the first green color filter 24G and the second green color filter 26G are formed in the plan view. In addition, the display device 402 includes a red subpixel RP in a position in which the first red color filter 24R and the second red color filter 26R are formed in the plan view.

Here, in the present embodiment, in particular, for the blue light from the blue light-emitting layer 14 and the red light from the red light-emitting layer 18, the number of transmitted layers is different in addition to a distance to the first color filter 24 and the second color filter 26 in the first direction D1 and the second direction D2. When the light is transmitted through many layers, the light is greatly affected by reflection on an interface between the layers. Thus, the white light in the first direction D1 and the white light in the second direction D2 are the white light in points different from each other on the chromaticity diagram, and have a different white balance.

Similarly to the display device according to each of the embodiments described above, the display device 402 according to the present embodiment can have a configuration that can reduce a difference in tinge when visually recognized from each of the first direction D1 and the second direction D2 different from each other. In addition, the display device 402 according to the present embodiment includes the blue light-emitting layer 14, the green light-emitting layer 16, and the red light-emitting layer 18 in the light-emitting element layers independent from one another. Thus, in the present embodiment, design of a level of each layer of each of the light-emitting element layers may be set as optimal design for causing only a corresponding light-emitting layer to emit light, and thus design of each of the light-emitting element layers is facilitated.

Modified Example

Figure 10:
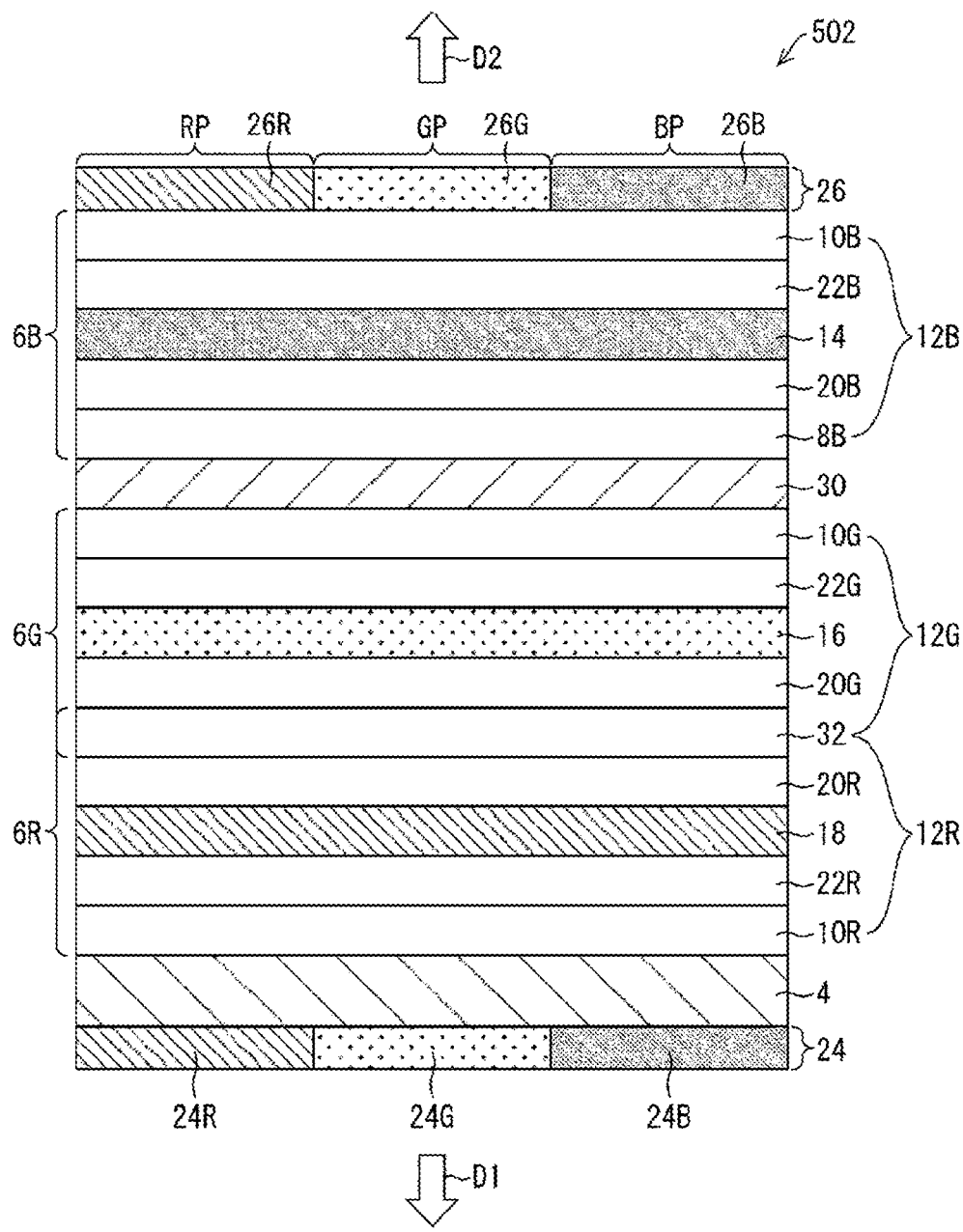
FIG. 10 is a schematic cross-sectional view of a display device according to a modified example of the third embodiment of the disclosure.

FIG. 10 is a schematic cross-sectional view illustrating a display device 502 according to a modified example of the present embodiment.

The cathode electrode 8G of the green light-emitting element layer 6G and the cathode electrode 8R of the red light-emitting element layer 6R according to the present modified example are replaced with a shared cathode electrode 32 as compared to the display device 402 according to the present embodiment. In other words, the electrode pair 12G of the green light-emitting element layer 6G and the electrode pair 12R of the red light-emitting element layer 6R share the shared cathode electrode 32.

Accordingly, the red light-emitting element layer 6R according to the present modified example has a reversed layering order of layers as compared to the display device 402 according to the present embodiment. Specifically, the red light-emitting element layer 6R according to the present modified example includes the anode electrode 10R, the hole transport layer 22R, the red light-emitting layer 18, the electron transport layer 20, and the shared cathode electrode 32 from the substrate 4 side.

The green light-emitting element layer 6G and the red light-emitting element layer 6R can be individually driven by individually driving the anode electrode 10G and the anode electrode 10R.

Note that, in the present modified example, the green light-emitting element layer 6G and the red light-emitting element layer 6R share the shared cathode electrode 32 as the cathode electrode, and thus the display device 502 does not include the insulating layer 30 between the green light-emitting element layer 6G and the red light-emitting element layer 6R.

Except for the points described above, the display device 502 according to the present modified example has the same configuration as that of the display device 402 according to the present embodiment.

Similarly to the display device 402 according to the present embodiment, the display device 502 according to the present modified example can have a configuration that can reduce a difference in tinge when visually recognized from each of the first direction D1 and the second direction D2 different from each other. Furthermore, the display device 502 according to the present modified example can reduce the number of the cathode electrodes and the insulating layers to be formed, and can reduce a manufacturing cost.

Figure 11:
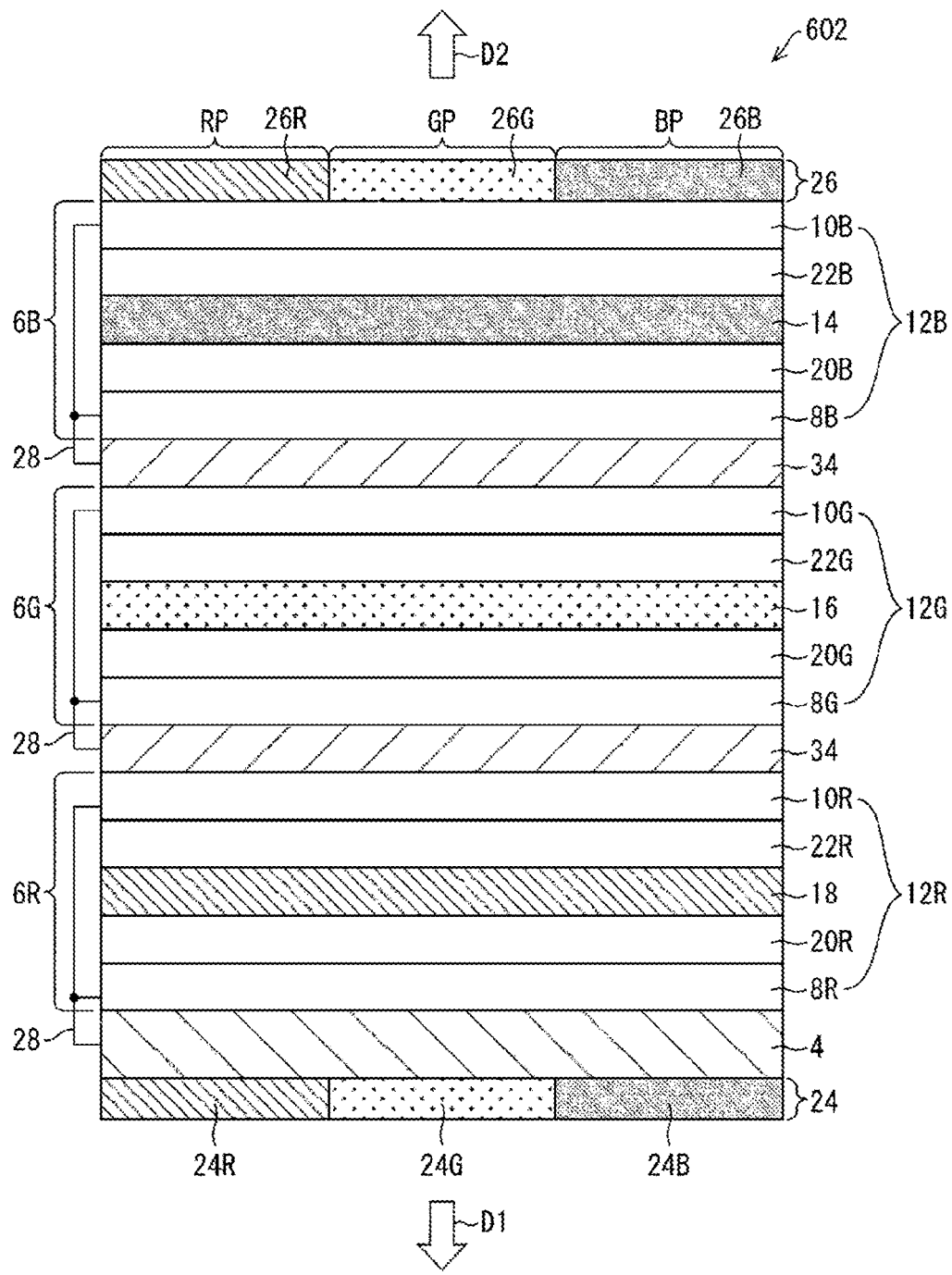
FIG. 11 is a schematic cross-sectional view of a display device according to another modified example of the third embodiment of the disclosure.

FIG. 11 is a schematic cross-sectional view illustrating a display device 602 according to another modified example of the present embodiment.

The display device 602 according to the present modified example includes an intermediate substrate 34 instead of the insulating layer 30 as compared to the display device 402 according to the present embodiment. In the present modified example, the substrate 4 and the intermediate substrate 34 include a TFT (not illustrated) for each light-emitting element layer. The intermediate substrate 34 between the blue light-emitting element layer 6B and the green light-emitting element layer 6G can individually drive the electrode pair 12B via the wiring line 28. The intermediate substrate 34 between the green light-emitting element layer 6G and the red light-emitting element layer 6R can individually drive the electrode pair 12G via the wiring line 28. The substrate 4 can individually drive the electrode pair 12R via the wiring line 28.

Except for the points described above, the display device 602 according to the present modified example has the same configuration as that of the display device 402 according to the present embodiment.

Similarly to the display device 402 according to the present embodiment, the display device 602 according to the present modified example can have a configuration that can reduce a difference in tinge when visually recognized from each of the first direction D1 and the second direction D2 different from each other. Furthermore, the display device 602 according to the present modified example can provide a display device of an active matrix method, and can perform high-speed drive of each of the subpixels.

A technique for reducing a difference between the emission light in the first direction D1 and the emission light in the second direction D2 from the display device by the first color filter 24 and the second color filter 26 in each of the embodiments described above will be described in detail with reference to FIGS. 12 to 16.

Figure 12:
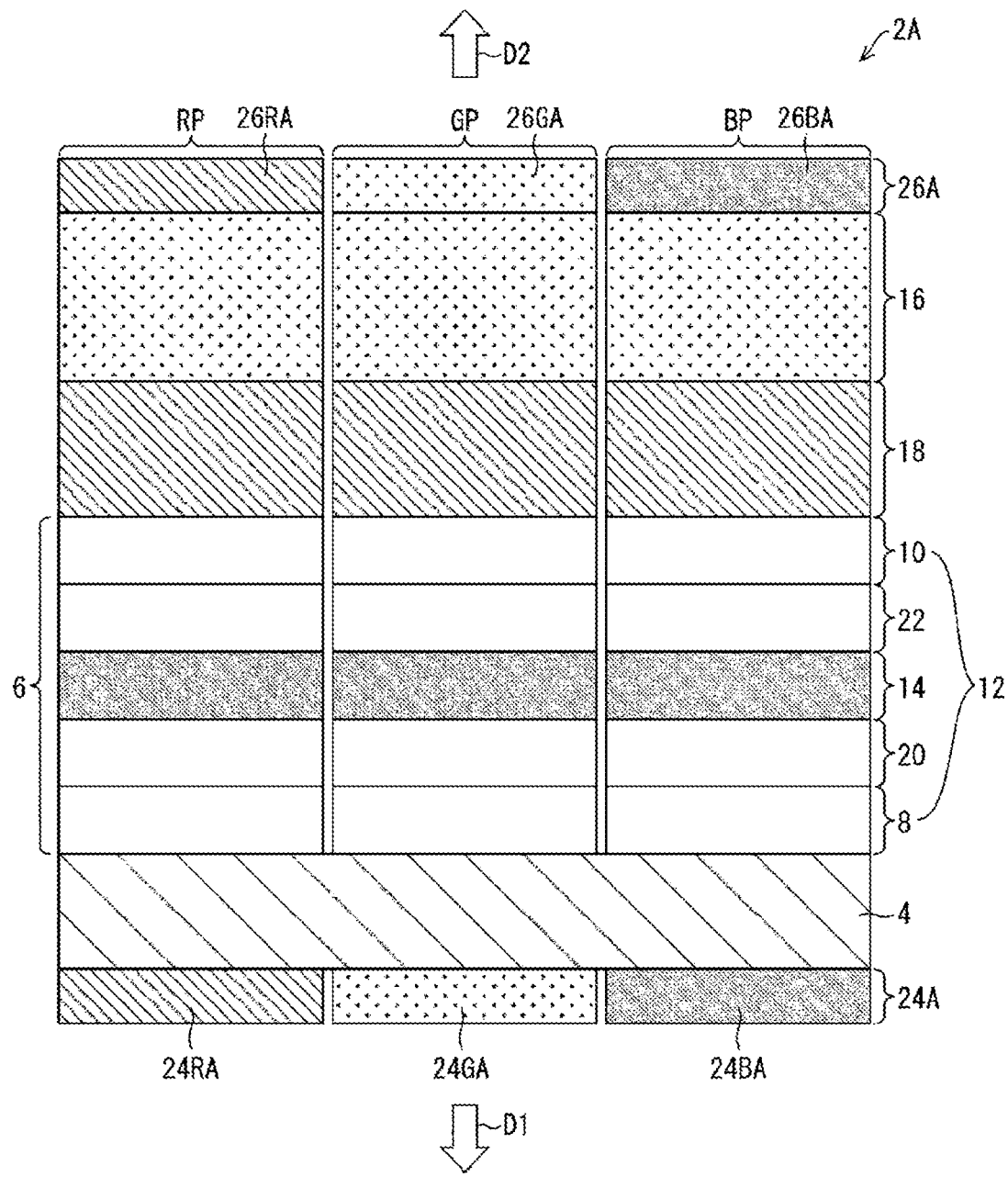
FIG. 12 is a schematic cross-sectional view of a display device according to a first comparative embodiment of the disclosure.

FIG. 12 is a schematic cross-sectional view of a display device 2A according to a first comparative embodiment. As compared to the display device 202 according to the second embodiment, the display device 2A according to the first comparative embodiment includes a first color filter 24A instead of the first color filter 24, and includes a second color filter 26A instead of the second color filter 26. Except for the points described above, the display device 2A according to the first comparative embodiment has the same configuration as that of the display device 202 according to the second embodiment.

In the present comparative embodiment, the first color filter 24A includes a first blue color filter 24BA that transmits the blue light, a first green color filter 24GA that transmits the green light, and a first red color filter 24RA that transmits the red light. Similarly, the second color filter 26A includes a second blue color filter 26BA that transmits the blue light, a second green color filter 26GA that transmits the green light, and a second red color filter 26RA that transmits the red light.

In the present comparative embodiment, the first color filter 24A and the second color filter 26A have the same optical characteristics. For example, the first color filter 24A and the second color filter 26A may be the same color filter. Specifically, the first blue color filter 24BA and the second blue color filter 26BA have the same transmittance of the blue light. Further, the first green color filter 24GA and the second green color filter 26GA have the same transmittance of the green light. Furthermore, the first red color filter 24RA and the second red color filter 26RA have the same transmittance of the red light.

Figure 13:
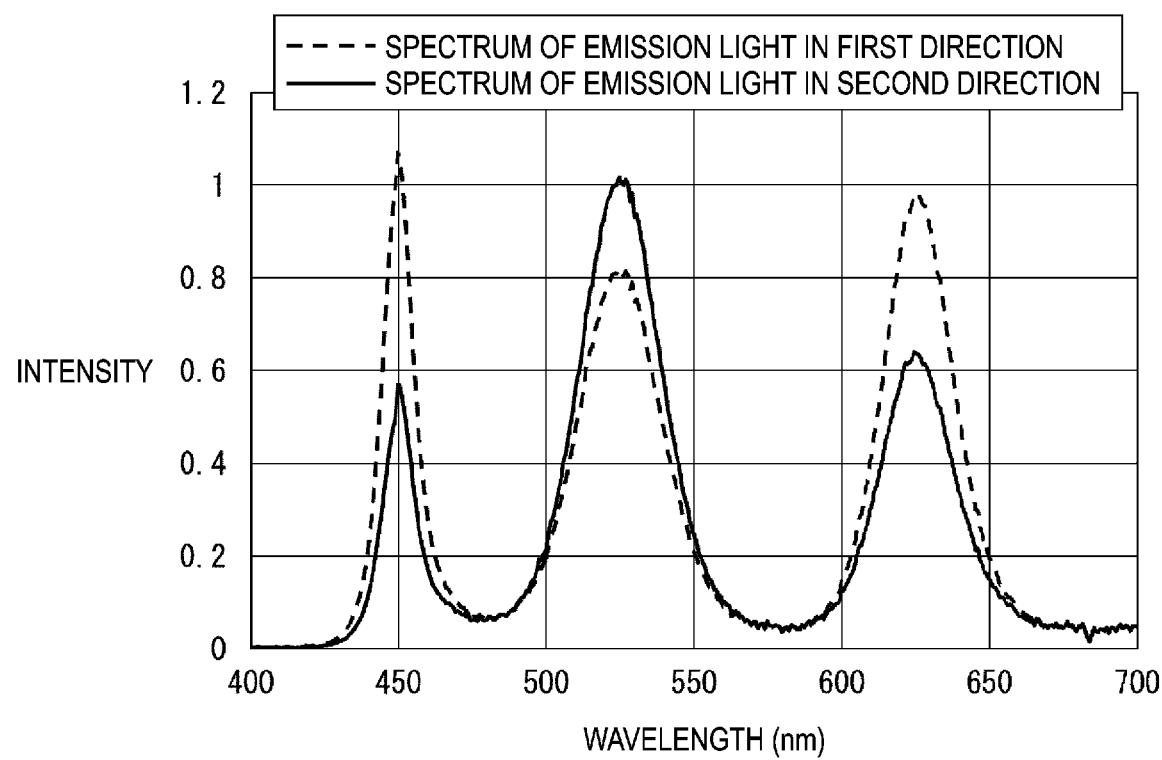
FIG. 13 is a spectrum diagram of emission light of the display device according to the first comparative embodiment of the disclosure.

FIG. 13 is a spectrum diagram for light obtained when all subpixels of the display device 2A according to the present comparative embodiment are caused to emit light. In FIG. 13, a horizontal axis represents a wavelength of the light (unit nm), and a vertical axis represents intensity of the light (any unit). A dotted line in FIG. 13 is a spectrum diagram for the emission light in the first direction D1, and a solid line in FIG. 13 is a spectrum diagram for the emission light in the second direction D2.

Note that the "intensity" of light described in the present specification including FIG. 13 refers to the intensity of light sensed by a human body in consideration of visibility of the human body. In other words, in the present specification, it can be said that the white light in which the blue light, the green light, and the red light have substantially the same intensity is also the white light having a substantially balanced white balance for eyes of the human body.

When all of the subpixels of the display device 2A are caused to emit light, it is ideal to obtain the white light in which the blue light, the green light, and the red light have the same intensity regardless of a direction of the emission light. However, in the present comparative embodiment, as shown in FIG. 13, the emission light in the first direction D1 has higher intensity of the blue light and the red light and lower intensity of the green light than those of the emission light in the second direction D2. Thus, the emission light in the first direction D1 has a tinge of purple as compared to the emission light in the second direction D2, whereas the emission light in the second direction D2 has a tinge of green as compared to the emission light in the first direction D1.

Thus, a difference in tinge of the emission light occurs when the display device 2A is visually recognized from the first direction D1 and when the display device 2A is visually recognized from the second direction D2. Therefore, when the display device 2A is visually recognized from each of the first direction D1 and the second direction D2, the white balance of the emission light is lost, and the display quality decreases.

Here, an example of a difference in the optical characteristics between the first color filter 24 and the second color filter 26 according to each of the embodiments described above will be described with reference to FIGS. 14 and 15.

Figure 14:
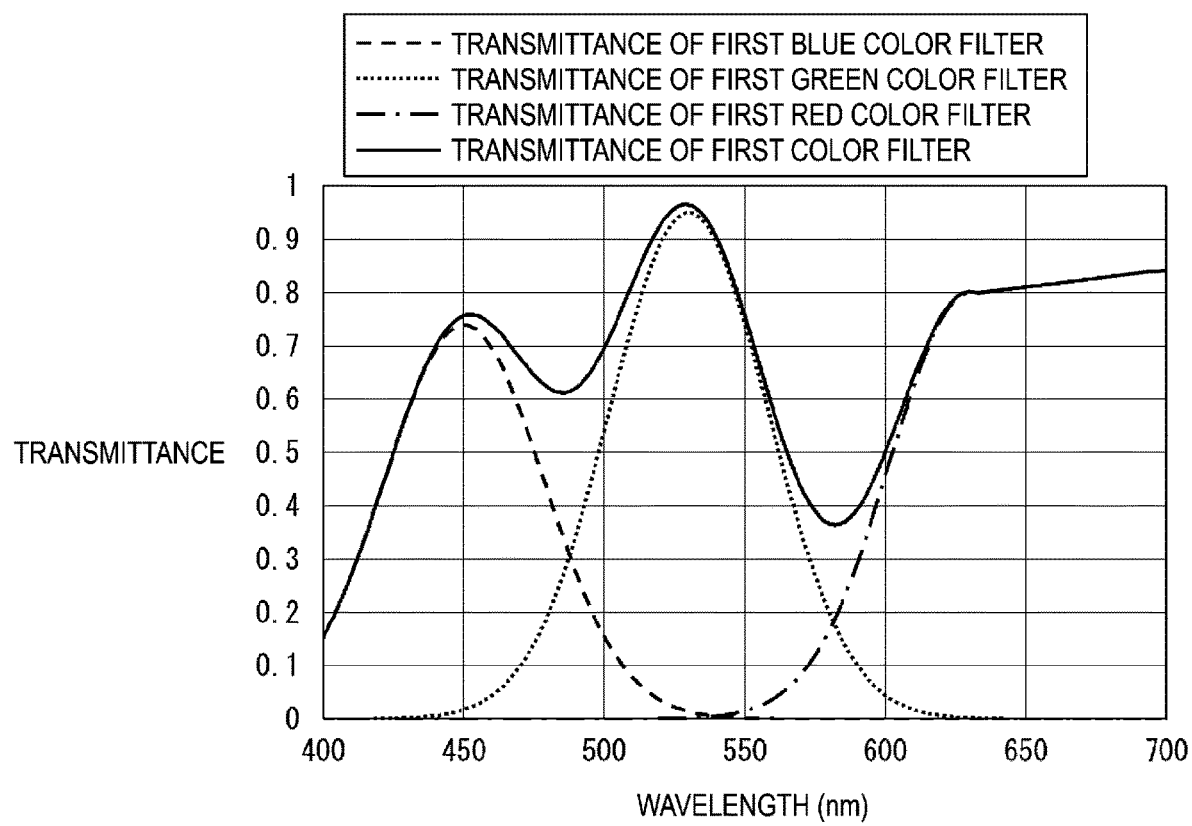
FIG. 14 is a transmission spectrum diagram of a first color filter according to the second embodiment of the disclosure.
Figure 15:
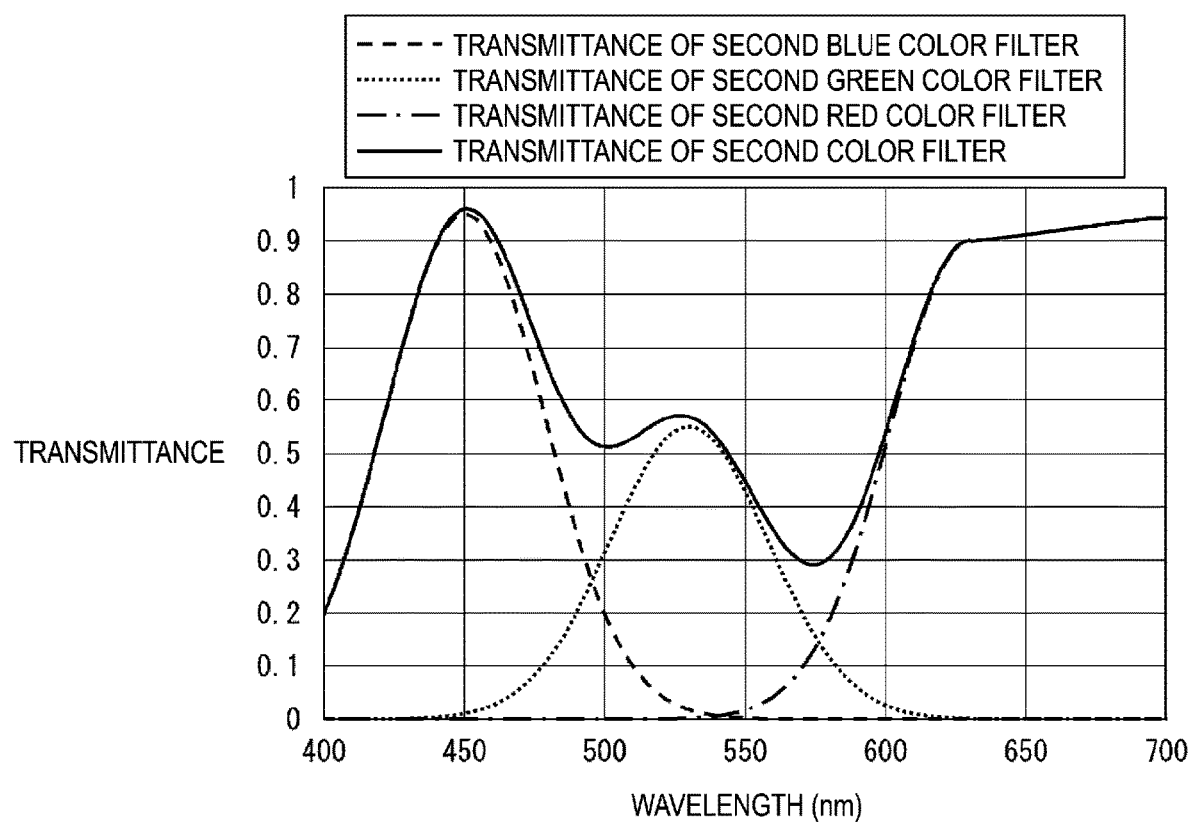
FIG. 15 is a transmission spectrum diagram of a second color filter according to the second embodiment of the disclosure.

FIG. 14 is a spectrum diagram showing the optical characteristics of the first color filter 24 according to the second embodiment. FIG. 15 is a spectrum diagram showing the optical characteristics of the second color filter 26 according to the second embodiment. In FIGS. 14 and 15, a horizontal axis represents a wavelength of light (unit nm), and a vertical axis represents a transmittance (unit %).

A broken line in FIG. 14 is a transmission spectrum diagram for the first blue color filter 24BA. A dotted line in FIG. 14 is a transmission spectrum diagram for the first green color filter 24GA.

A dash-dot line in FIG. 14 is a transmission spectrum diagram for the first red color filter 24RA. A solid line in FIG. 14 is a transmission spectrum diagram of the entire first color filter 24.

A broken line in FIG. 15 is a transmission spectrum diagram for the second blue color filter 26BA. A dotted line in FIG. 15 is a transmission spectrum diagram for the second green color filter 26GA.

A dash-dot line in FIG. 15 is a transmission spectrum diagram for the second red color filter 26RA. A solid line in FIG. 15 is a transmission spectrum diagram of the entire second color filter 26.

As shown in FIGS. 14 and 15, the first color filter 24 transmits more green light and absorbs the blue light and the red light more strongly as compared to the second color filter 26. Meanwhile, the second color filter 26 transmits more blue light and more red light and absorbs the green light more strongly as compared to the first color filter 24.

Figure 16:
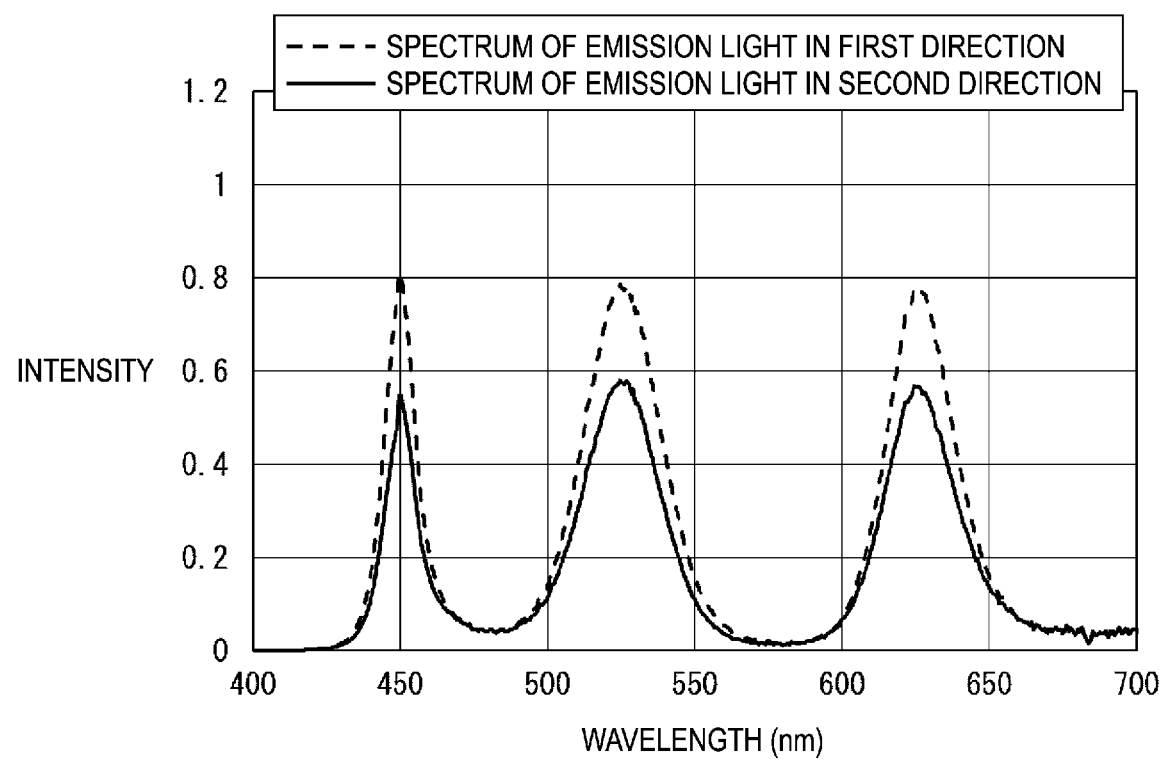
FIG. 16 is a spectrum diagram of emission light of the display device according to the second embodiment of the disclosure

FIG. 16 is a spectrum diagram for light obtained when all of the subpixels of the display device 202 according to the second embodiment are caused to emit light. In FIG. 16, a horizontal axis represents a wavelength of the light (unit nm), and a vertical axis represents intensity of the light (any unit). A dotted line in FIG. 16 is a spectrum diagram for the emission light in the first direction D1, and a solid line in FIG. 16 is a spectrum diagram for the emission light in the second direction D2.

The display device 202 according to the second embodiment has the same configuration as that of the display device 2A according to the first comparative embodiment except for each of the color filters. Therefore, it is conceivable that the emission light from the light-emitting element layer 6 before being transmitted through each of the color filters has higher intensity of the blue light and the red light in the first direction D1 and higher intensity of the green light in the second direction D2 as shown in FIG. 13.

However, as described above, the display device 202 according to the second embodiment includes the first color filter 24 that transmits more green light and absorbs the blue light and the red light more strongly, and the second color filter 26 that transmits more blue light and more red light and absorbs the green light more strongly. Therefore, the blue light and the red light in the emission light transmitted through the first color filter 24 are absorbed more strongly, and the green light in the emission light transmitted through the second color filter 26 is absorbed more strongly.

Thus, as shown in FIG. 16, the blue light, the green light, and the red light have substantially the same intensity in the emission light in each of the first direction D1 and the second direction D2. Thus, a difference in tinge of the emission light is reduced when the display device 202 is visually recognized from the first direction D1 and when the display device 202 is visually recognized from the second direction D2. Therefore, when the display device 202 is visually recognized from each of the first direction D1 and the second direction D2, the white balance of the emission light is performed, and the display quality is improved.

In the description above, the technique for reducing a difference in tinge of the emission light in the first direction D1 and the second direction D2 of the display device 202 according to the second embodiment is described as an example. However, a difference in tinge of the emission light in the first direction D1 and the second direction D2 can also be reduced by a similar technique in another embodiment. Specifically, each of the color filters may have the optical characteristics such that each of the color filters absorbs a wavelength component having high intensity of the emission light before being transmitted through the color filter in each of the first direction D1 and the second direction D2 from each display device.

Fourth Embodiment

Figure 17:
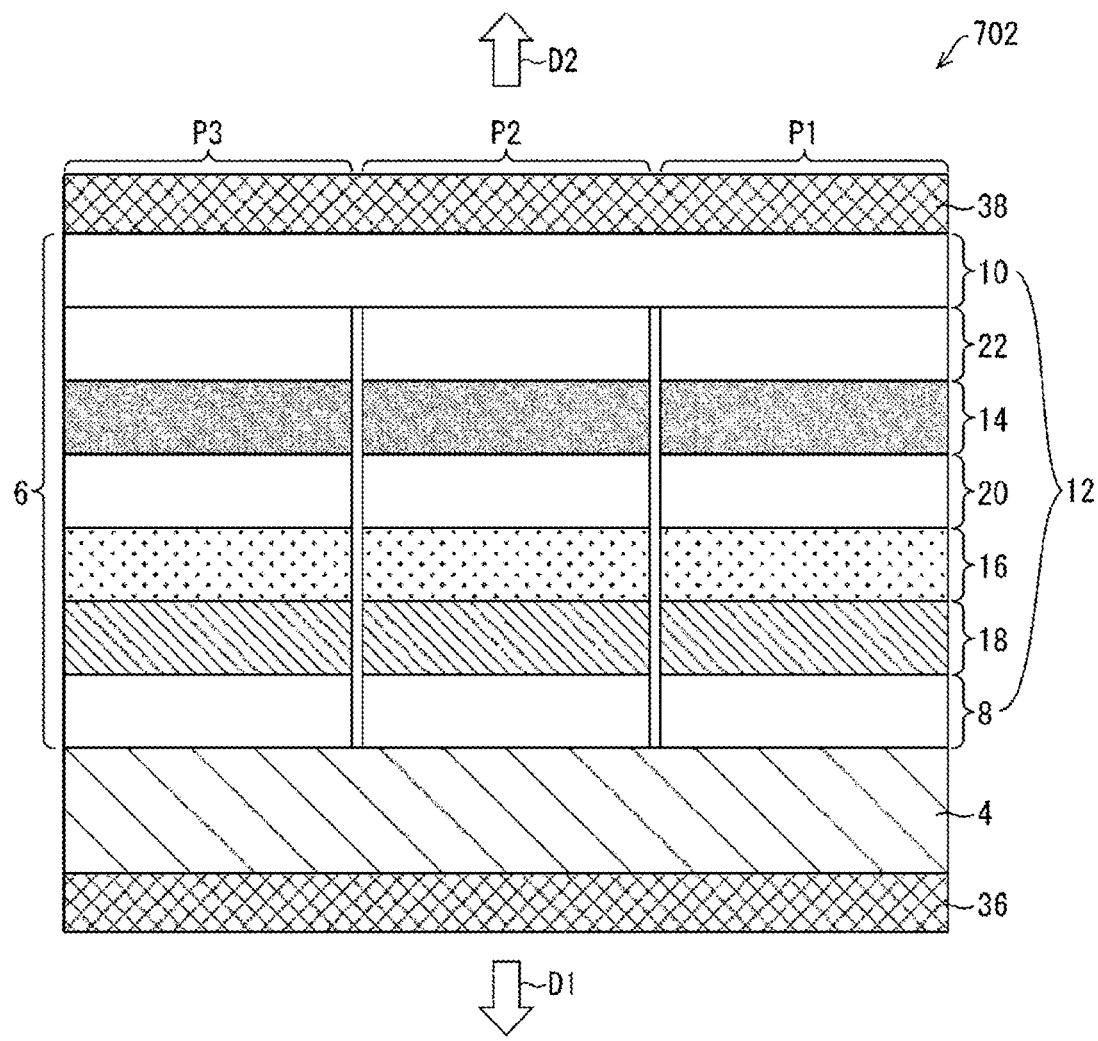
FIG. 17 is a schematic cross-sectional view of a display device according to a fourth embodiment of the disclosure.

FIG. 17 is a schematic cross-sectional view illustrating a display device 702 according to the present embodiment.

As compared to the display device 2 according to the first embodiment, the display device 702 according to the present embodiment includes a first wavelength filter 36 instead of the first color filter 24, and includes a second wavelength filter 38 instead of the second color filter 26. In other words, the display device 702 according to the present embodiment includes the first wavelength filter 36 as a first optical filter, and includes the second wavelength filter 38 as a second optical filter.

In the present embodiment, the first wavelength filter 36 and the second wavelength filter 38 have optical characteristics different from each other. Specifically, the first wavelength filter 36 and the second wavelength filter 38 have transmission spectra different from each other.

The first wavelength filter 36 and the second wavelength filter 38 are formed in common to all intersection points between a cathode electrode 8 and an anode electrode 10 in the plan view. Thus, substantially uniform emission light can be obtained from the display device 702 according to the present embodiment in the first direction D1 regardless of a position of the display device 702 in the plan view. For the same reason, substantially uniform emission light can also be obtained from the display device 702 according to the present embodiment in the second direction D2 regardless of a position of the display device 702 in the plan view.

For example, when the first wavelength filter 36 and the second wavelength filter 38 transmit each of the blue light, the green light, and the red light at an appropriate ratio, the white light can be obtained from the display device 702 in both of the first direction D1 and the second direction D2.

Here, in the present embodiment, the display device 702 includes a subpixel at each of the intersection points between the cathode electrode 8 and the anode electrode 10 in the plan view. Thus, the display device 702 in the present embodiment can drive an electrode pair 12 on a subpixel-by-subpixel basis, and achieves a display device that enables monochrome display.

Figure 18:
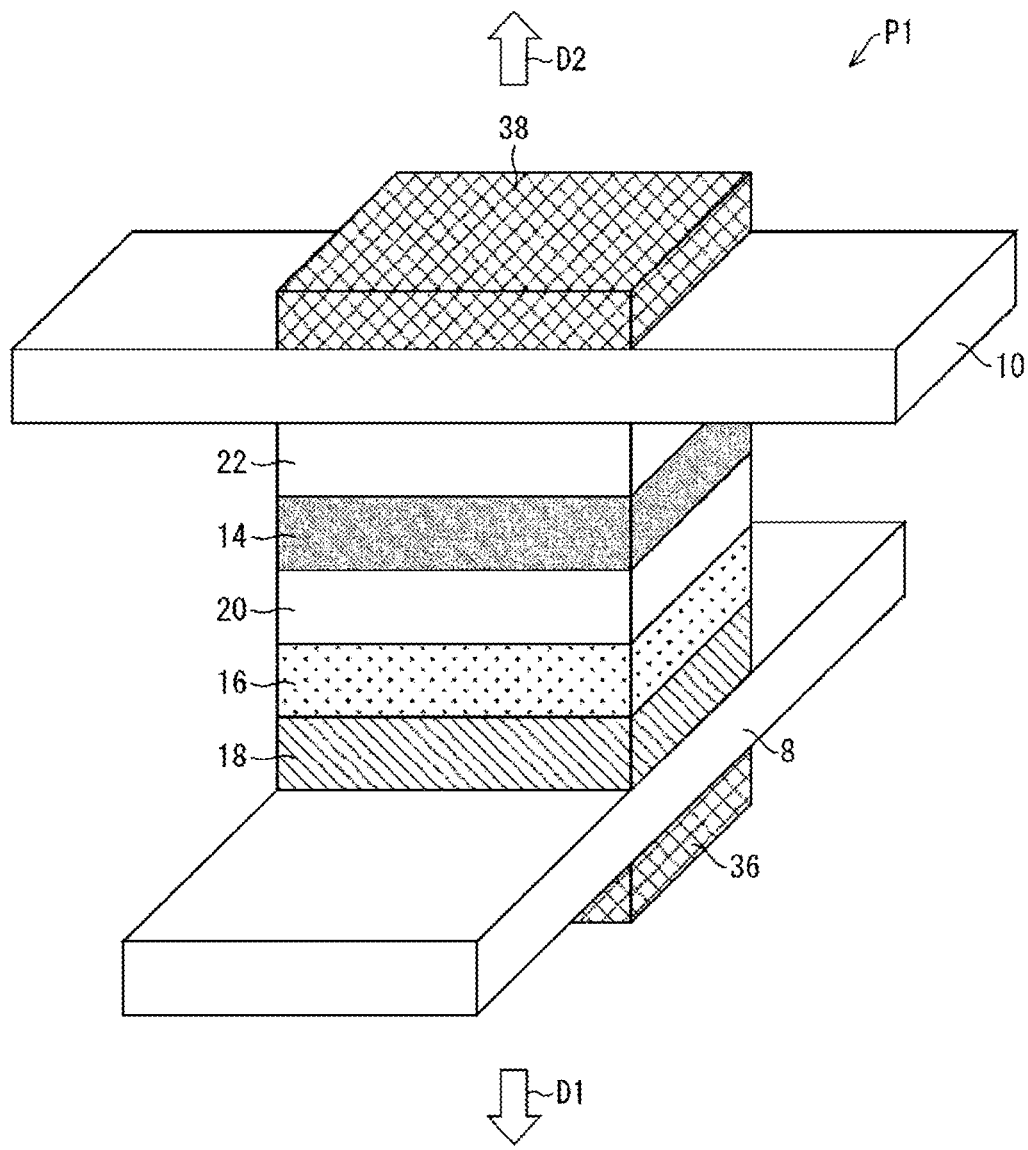
FIG. 18 is a schematic perspective view of a first subpixel of the display device according to the fourth embodiment of the disclosure.

Note that FIG. 17 illustrates a first subpixel P1, a second subpixel P2, and a third subpixel P3 as an example of the subpixels. FIG. 18 is a schematic perspective view illustrating the first subpixel P1 according to the present embodiment. In the present embodiment, each of the subpixels included in the display device 702 may have the same configuration as that of the first subpixel P1 illustrated in FIG. 18.

Except for the points described above, the display device 702 according to the present embodiment has the same configuration as that of the display device 2 according to the first embodiment.

Similarly to the display device according to each of the embodiments described above, the display device 702 according to the present embodiment can have a configuration that can reduce a difference in tinge when visually recognized from each of the first direction D1 and the second direction D2 different from each other. Since the display device 702 according to the present embodiment includes, as the optical filter, the wavelength filter common to the subpixels, a color filter and the like do not need to be individually formed for each of the subpixels. Therefore, the display device 702 according to the present embodiment can constitute a display device with a simpler configuration.

Note that, in the present embodiment, the transmittances of the first wavelength filter 36 and the second wavelength filter 38 may not be different with respect to all of the three colors described above in order to obtain the advantageous effect described above. In order to obtain the advantageous effect described above, a ratio of the transmittance in each luminescent color wavelength may be adjusted to reduce a difference in tinge. In other words, in the present embodiment, the transmittance of the first wavelength filter 36 and the transmittance of the second wavelength filter 38 may be the same transmittance with respect to light of a certain color. The same also applies to each subsequent embodiment.

Modified Example

Figure 19:
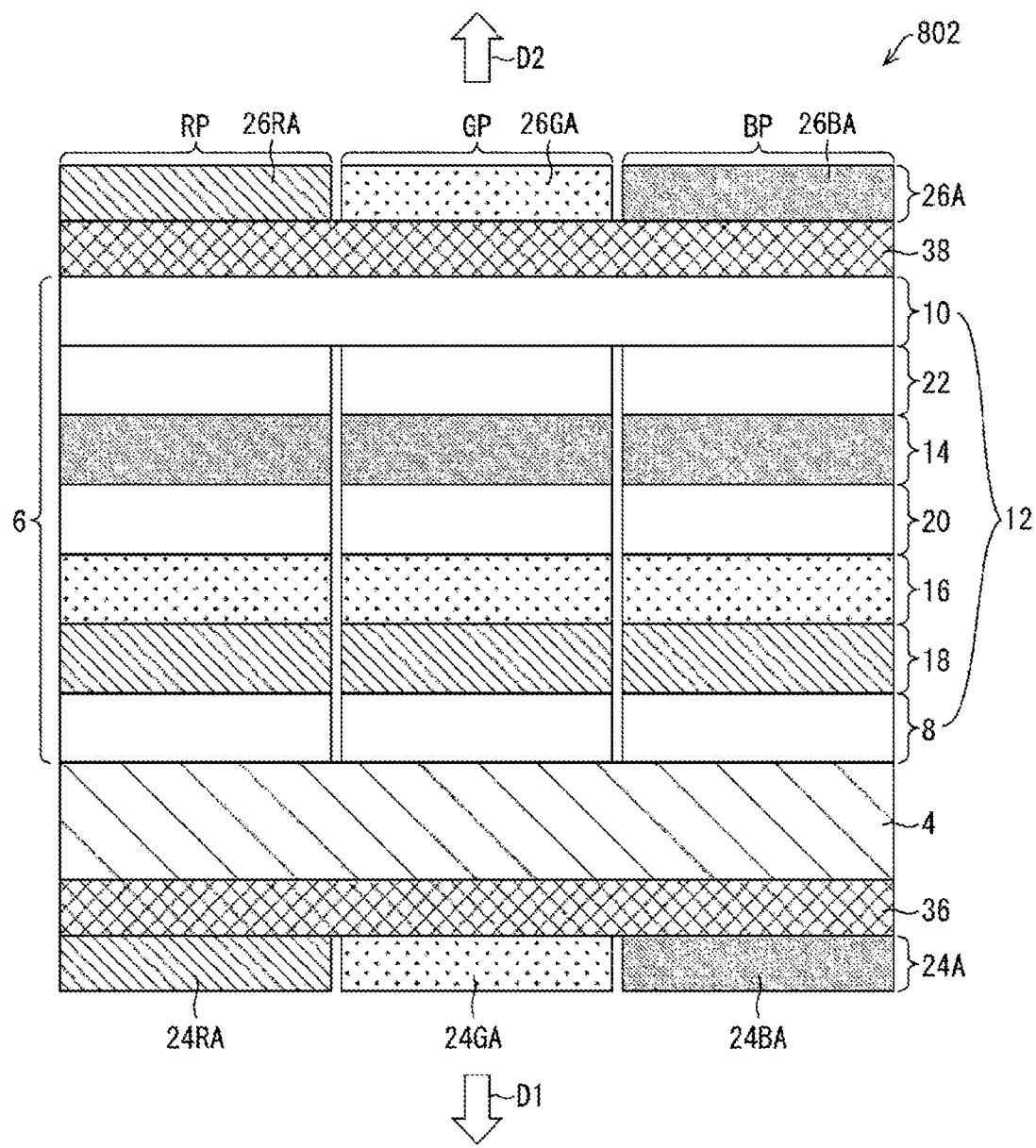
FIG. 19 is a schematic cross-sectional view of a display device according to a modified example of the fourth embodiment of the disclosure.

FIG. 19 is a schematic cross-sectional view illustrating a display device 802 according to a modified example of the present embodiment.

As compared to the display device 702 according to the present embodiment, the display device 802 according to the present modified example includes a first color filter 24A closer to the first direction D1 side than the first wavelength filter 36. Further, as compared to the display device 702 according to the present embodiment, the display device 802 according to the present modified example includes a second color filter 26A closer to the second direction D2 side than the second wavelength filter 38.

In the present modified example, each of the first color filter 24A and the second color filter 26A has the same configuration as that of each of the first color filter 24A and the second color filter 26A described in the first comparative embodiment. In other words, the first color filter 24A and the second color filter 26A may have the same optical characteristics.

Thus, similarly to the display device 2 according to the first embodiment, a blue subpixel BP is formed in a position in which a first blue color filter 24BA and a second blue color filter 26BA are formed in the plan view. Further, a green subpixel GP is formed in a position in which a first green color filter 24GA and a second green color filter 26GA are formed in the plan view. Similarly, a red subpixel RP is formed in a position in which a first red color filter 24RA and a second red color filter 26RA are formed in the plan view. Therefore, the display device 802 according to the present modified example achieves color display by controlling drive of each of the subpixels.

Except for the points described above, the display device 802 according to the present modified example has the same configuration as that of the display device 702 according to the present embodiment.

Similarly to the display device 702 according to the present embodiment, the display device 802 according to the present modified example can have a configuration that can reduce a difference in tinge when visually recognized from each of the first direction D1 and the second direction D2 different from each other.

Further, in the display device 802 according to the present modified example, the first wavelength filter 36 and the second wavelength filter 38 have the optical characteristics different from each other. Thus, the optical characteristics of the first red color filter 24RA and the second red color filter 26RA do not need to be set different for reducing a difference in tinge described above. Therefore, in the present modified example, a display device that enables color display can be easily achieved only by employing, for example, the same known color filter in the related art as the first red color filter 24RA and the second red color filter 26RA.

Fifth Embodiment

Figure 20:
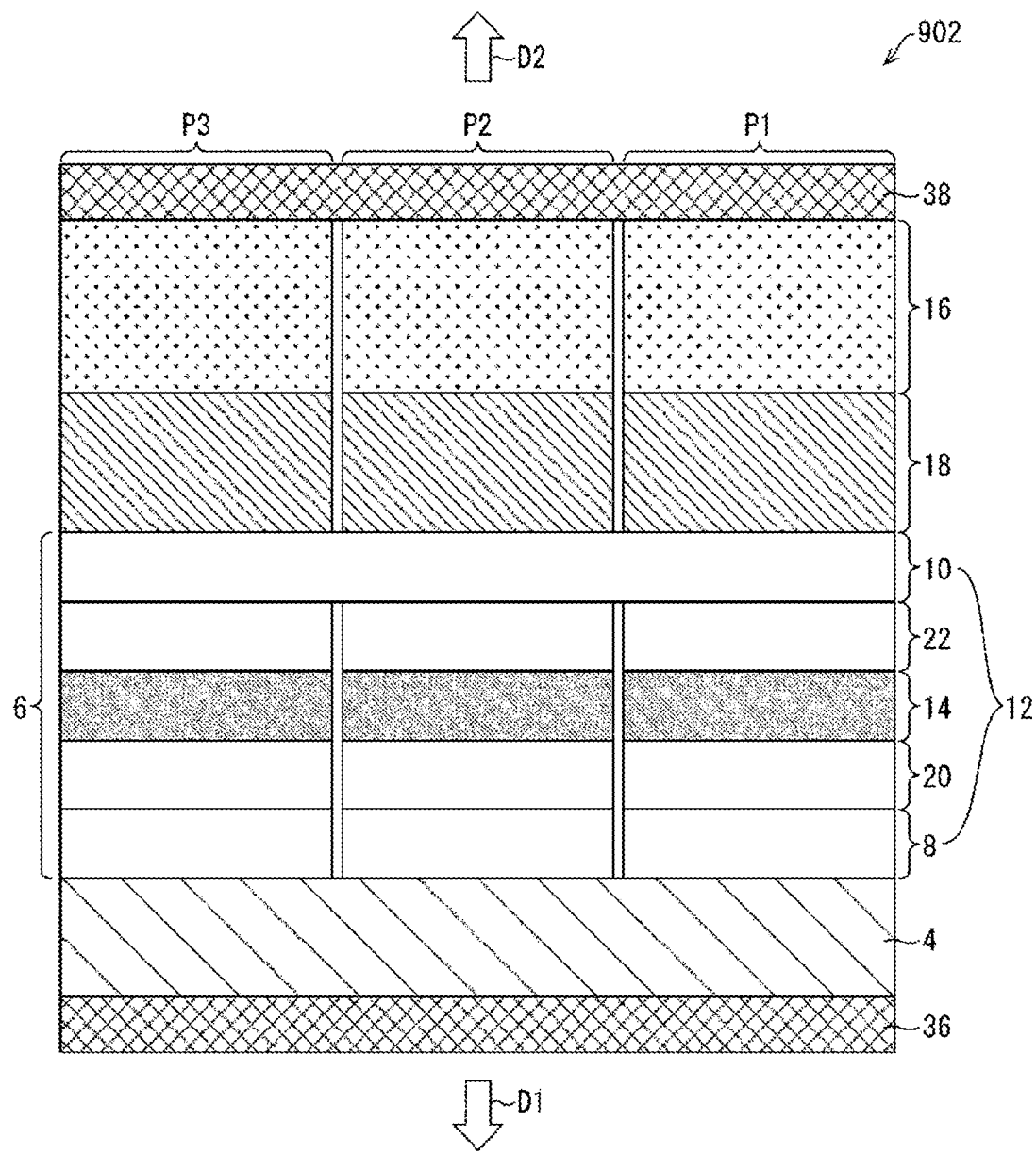
FIG. 20 is a schematic cross-sectional view of a display device according to a fifth embodiment of the disclosure.

FIG. 20 is a schematic cross-sectional view illustrating a display device 902 according to the present embodiment.

As compared to the display device 202 according to the second embodiment, the display device 902 according to the present embodiment includes a first wavelength filter 36 instead of the first color filter 24, and includes a second wavelength filter 38 instead of the second color filter 26. In other words, the display device 902 according to the present embodiment includes the first wavelength filter 36 as a first optical filter, and includes the second wavelength filter 38 as a second optical filter.

Each of the first wavelength filter 36 and the second wavelength filter 38 according to the present embodiment has the same configuration as that of each of the first wavelength filter 36 and the second wavelength filter 38 according to the previous embodiment except for the optical characteristics. Therefore, similarly to the display device 702 according to the previous embodiment, in the display device 902 according to the present embodiment, substantially uniform emission light can also be obtained from the display device 902 according to the present embodiment in the first direction D1 regardless of a position of the display device 902 in the plan view. Further, substantially uniform emission light can also be obtained from the display device 902 according to the present embodiment in the second direction D2 regardless of a position of the display device 902 in the plan view.

Also in the present embodiment, the display device 902 includes a subpixel at each of intersection points between a cathode electrode 8 and an anode electrode 10 in the plan view. Thus, the display device 902 in the present embodiment can drive an electrode pair 12 on a subpixel-by-subpixel basis, and achieves a display device that enables monochrome display.

Figure 21:
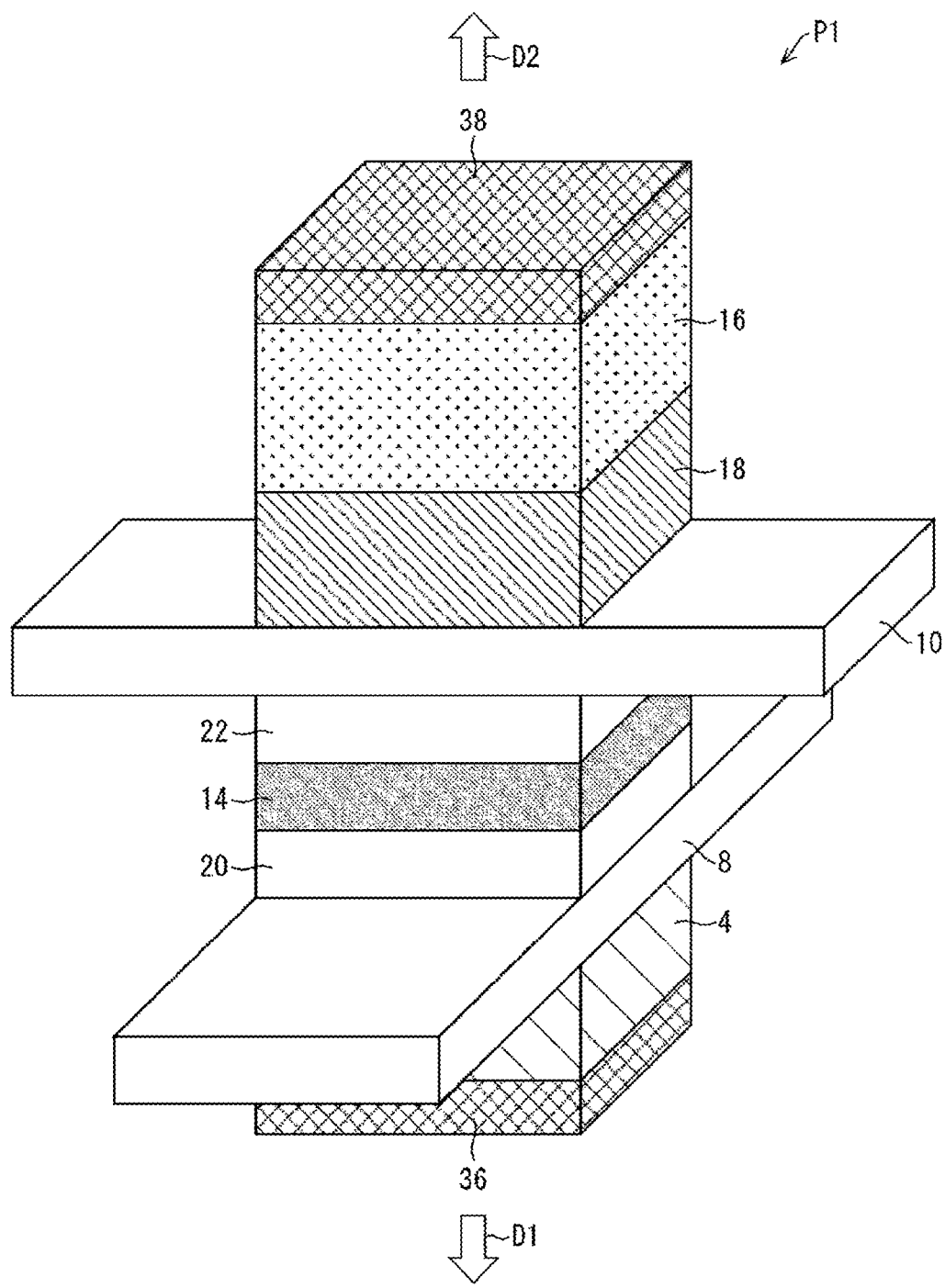
FIG. 21 is a schematic perspective view of a first subpixel of the display device according to the fifth embodiment of the disclosure.

Note that, similarly to FIG. 17, FIG. 20 also illustrates a first subpixel P1, a second subpixel P2, and a third subpixel P3 as an example of the subpixels. FIG. 21 is a schematic perspective view illustrating the first subpixel P1 according to the present embodiment. In the present embodiment, each of the subpixels included in the display device 902 may have the same configuration as that of the first subpixel P1 illustrated in FIG. 21.

Except for the points described above, the display device 902 according to the present embodiment has the same configuration as that of the display device 202 according to the second embodiment.

Similarly to the display device according to each of the embodiments described above, the display device 902 according to the present embodiment can have a configuration that can reduce a difference in tinge when visually recognized from each of the first direction D1 and the second direction D2 different from each other. Since the display device 902 according to the present embodiment includes, as the optical filter, the wavelength filter common to the subpixels, a color filter and the like do not need to be individually formed for each of the subpixels. Therefore, the display device 902 according to the present embodiment can constitute the display device by a more simplified configuration.

Modified Example

Figure 22:
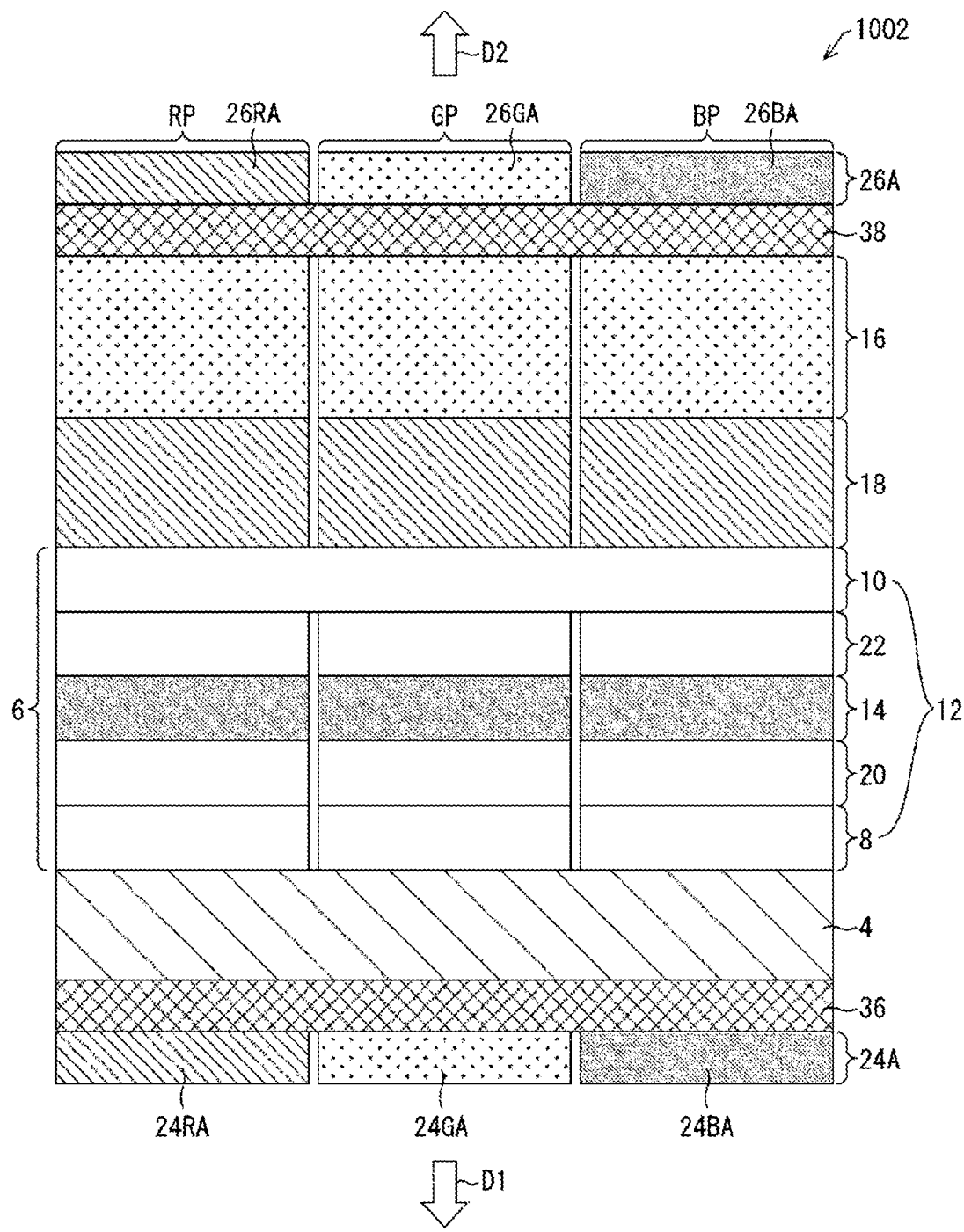
FIG. 22 is a schematic cross-sectional view of a display device according to a modified example of the fifth embodiment of the disclosure.

FIG. 22 is a schematic cross-sectional view illustrating a display device 1002 according to a modified example of the present embodiment.

As compared to the display device 902 according to the present embodiment, the display device 1002 according to the present modified example includes a first color filter 24A closer to the first direction D1 side than the first wavelength filter 36. Further, as compared to the display device 902 according to the present embodiment, the display device 1002 according to the present modified example includes a second color filter 26A closer to the second direction D2 side than the second wavelength filter 38.

In the present modified example, each of the first color filter 24A and the second color filter 26A has the same configuration as that of each of the first color filter 24A and the second color filter 26A described in the first comparative embodiment. In other words, the first color filter 24A and the second color filter 26A may have the same optical characteristics.

Thus, similarly to the display device 2 according to the first embodiment, a blue subpixel BP is formed in a position in which a first blue color filter 24BA and a second blue color filter 26BA are formed in the plan view. Further, a green subpixel GP is formed in a position in which a first green color filter 24GA and a second green color filter 26GA are formed in the plan view. Similarly, a red subpixel RP is formed in a position in which a first red color filter 24RA and a second red color filter 26RA are formed in the plan view. Therefore, the display device 1002 according to the present modified example achieves color display by controlling drive of each of the subpixels.

Except for the points described above, the display device 1002 according to the present modified example has the same configuration as that of the display device 902 according to the present embodiment.

Similarly to the display device 902 according to the present embodiment, the display device 1002 according to the present modified example can have a configuration that can reduce a difference in tinge when visually recognized from each of the first direction D1 and the second direction D2 different from each other.

Further, in the display device 1002 according to the present modified example, the first wavelength filter 36 and the second wavelength filter 38 have the optical characteristics different from each other. Thus, the optical characteristics of the first red color filter 24RA and the second red color filter 26RA do not need to be set different for reducing a difference in tinge described above. Therefore, in the present modified example, a display device that enables color display can be easily achieved only by employing, for example, the same known color filter in the related art as the first red color filter 24RA and the second red color filter 26RA.

Sixth Embodiment

Figure 23:
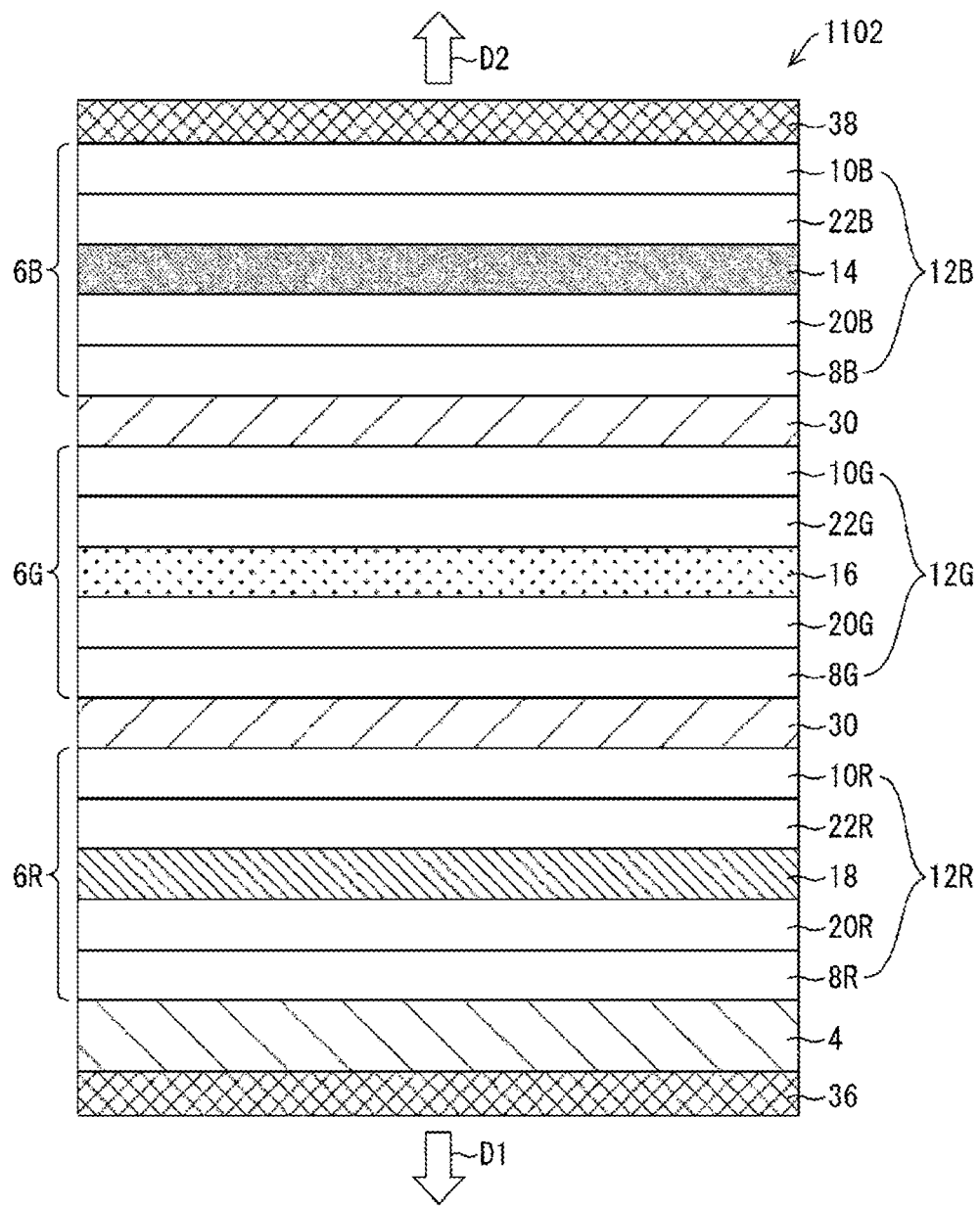
FIG. 23 is a schematic cross-sectional view of a display device according to a sixth embodiment of the disclosure.
Figure 24:
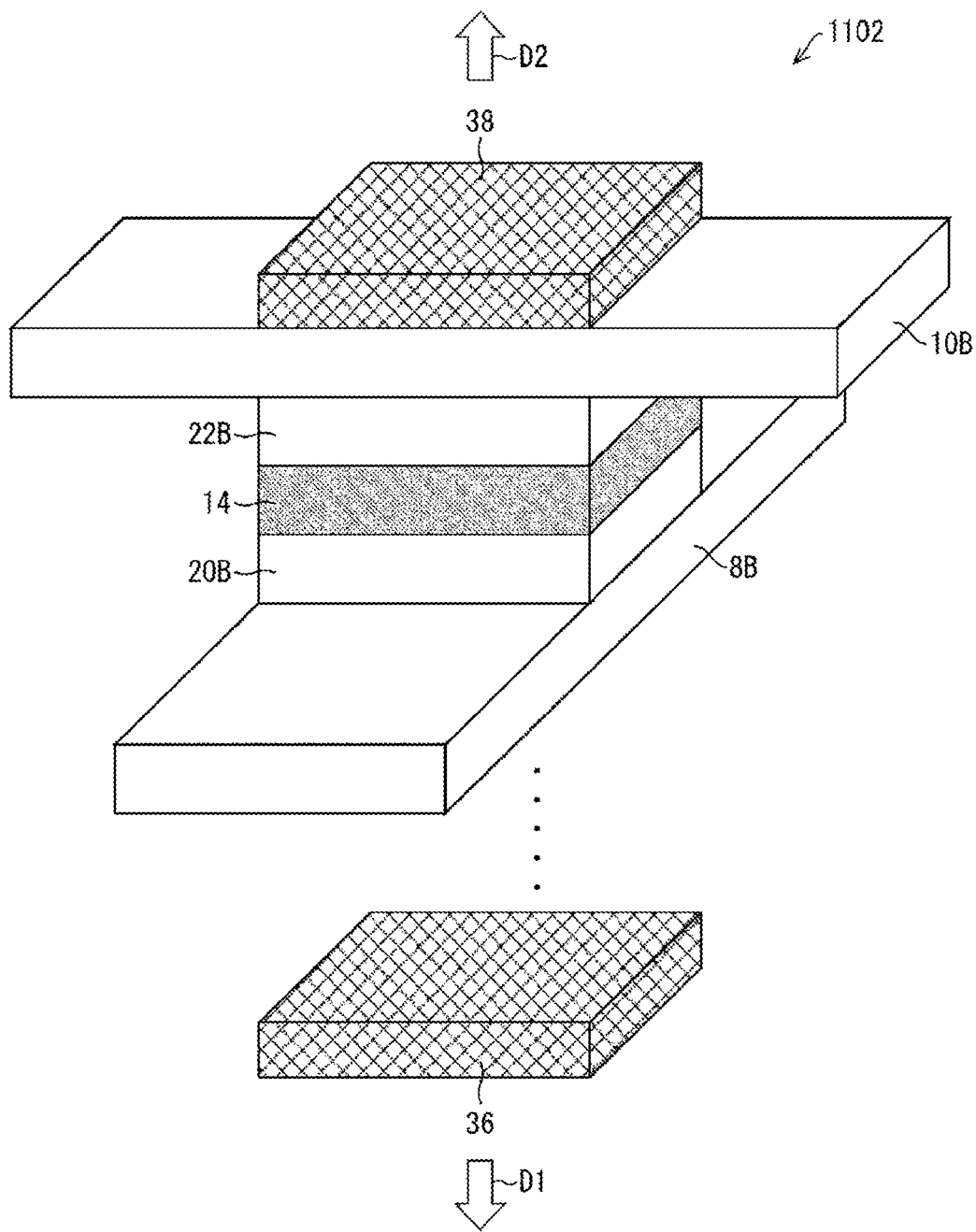
FIG. 24 is a schematic perspective view of the display device according to the sixth embodiment of the disclosure.

FIG. 23 is a schematic cross-sectional view illustrating a display device 1102 according to the present embodiment. FIG. 24 is a schematic perspective view illustrating the display device 1102 according to the present embodiment. Note that, similarly to FIG. 9, FIG. 24 extracts and illustrates only a blue light-emitting element layer 6B, a first wavelength filter 36, and a second wavelength filter 38.

As compared to the display device 402 according to the third embodiment, the display device 1102 according to the present embodiment includes the first wavelength filter 36 instead of the first color filter 24, and includes the second wavelength filter 38 instead of the second color filter 26. In other words, the display device 1102 according to the present embodiment includes the first wavelength filter 36 as a first optical filter, and includes the second wavelength filter 38 as a second optical filter.

Each of the first wavelength filter 36 and the second wavelength filter 38 according to the present embodiment has the same configuration as that of each of the first wavelength filter 36 and the second wavelength filter 38 according to the previous embodiment except for the optical characteristics.

The display device 1102 according to the present embodiment can individually drive each of the blue light-emitting element layer 6B, a green light-emitting element layer 6G, and a red light-emitting element layer 6R similarly to the display device 402 according to the third embodiment. Thus, although the display device 1102 according to the present embodiment does not include a color filter, multi-color emission light can be obtained.

For example, a unit including one blue light-emitting element layer 6B, one green light-emitting element layer 6G, and one red light-emitting element layer 6R illustrated in FIG. 23 may be set as one pixel, and a plurality of units may be included and arranged in parallel in the plan view. In this way, the display device 1102 according to the present embodiment achieves a display device that enables color display.

Except for the points described above, the display device 1102 according to the present embodiment has the same configuration as that of the display device 402 according to the third embodiment.

Similarly to the display device according to each of the embodiments described above, the display device 1102 according to the present embodiment can have a configuration that can reduce a difference in tinge when visually recognized from each of the first direction D1 and the second direction D2 different from each other.

Since the display device 1102 according to the present embodiment includes, as the optical filter, the wavelength filter common to the subpixels, a color filter and the like do not need to be individually formed for each of the subpixels. Furthermore, although the display device 1102 according to the present embodiment does not include a color filter, the display device 1102 enables color display. Therefore, the display device 1102 according to the present embodiment can constitute a display device that enables color display with a simpler configuration.

In addition, since the display device 1102 according to the present embodiment does not include a color filter, the light from each light-emitting element layer is not absorbed by the color filter, and thus the light can be more efficiently extracted.

A technique for reducing a difference between the emission light in the first direction D1 and the emission light in the second direction D2 from each of the display devices by the first wavelength filter 36 and the second wavelength filter 38 in the third to sixth embodiments described above will be described in detail with reference to FIGS. 25 to 28.

Figure 25:
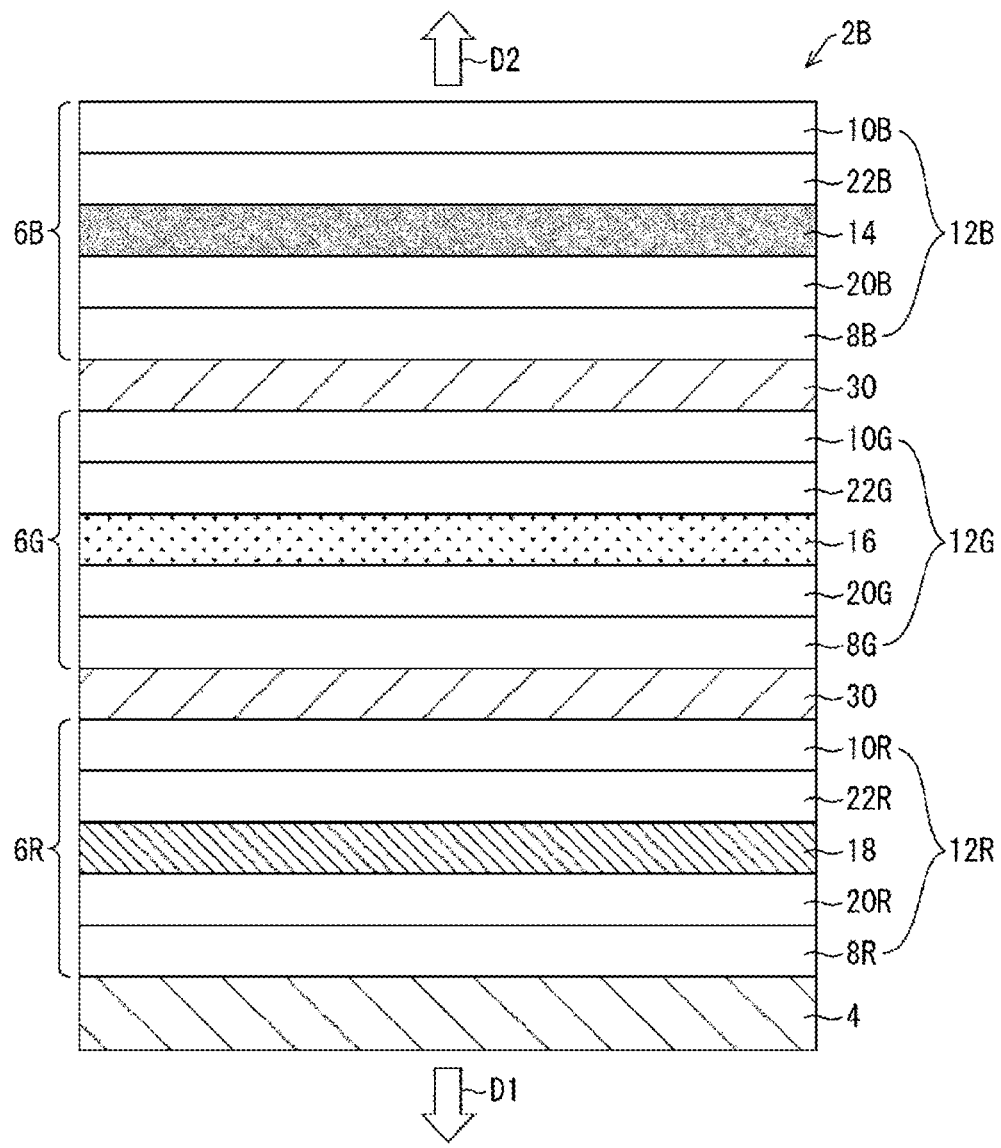
FIG. 25 is a schematic cross-sectional view of a display device according to a second comparative embodiment of the disclosure

FIG. 25 is a schematic cross-sectional view of a display device 2B according to a second comparative embodiment. As compared to the display device 1102 according to the sixth embodiment, the display device 2B according to the second comparative embodiment does not include the first wavelength filter 36 and the second wavelength filter 38. Except for the point described above, the display device 2B according to the second comparative embodiment has the same configuration as that of the display device 1102 according to the sixth embodiment.

Figure 26:
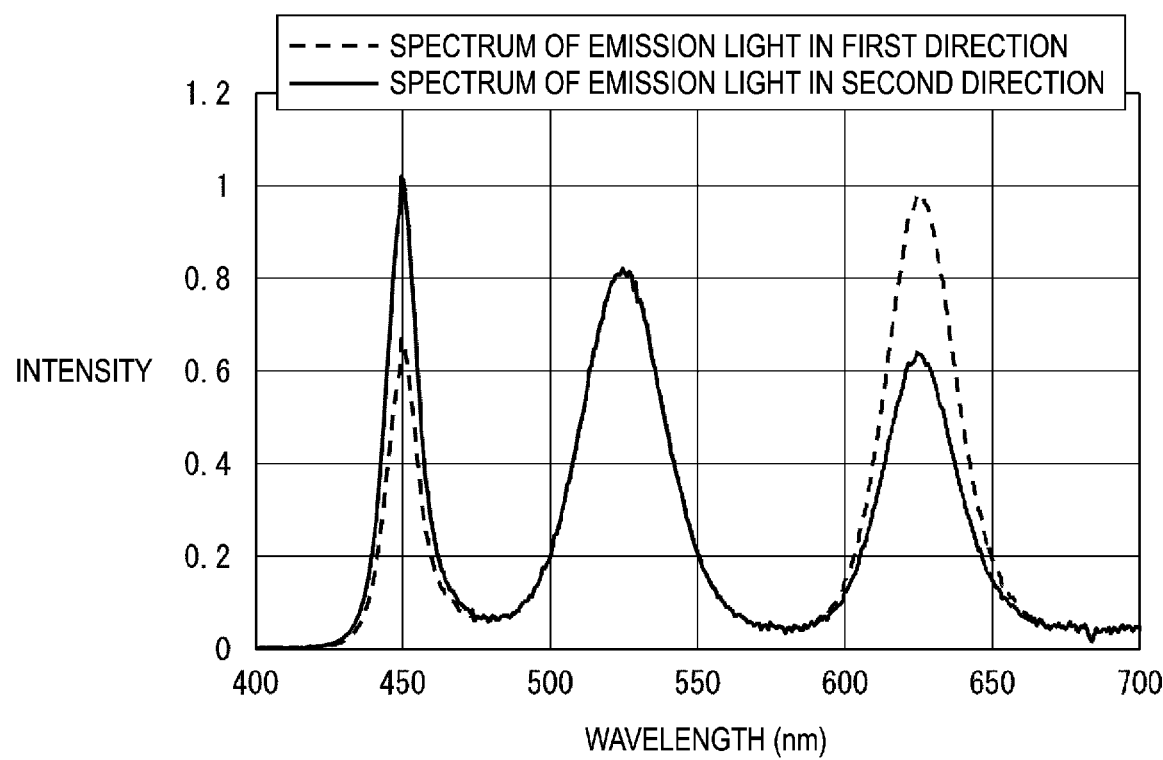
FIG. 26 is a spectrum diagram of emission light of the display device according to the second comparative embodiment of the disclosure.

FIG. 26 is a spectrum diagram for light obtained when all light-emitting elements of the display device 2B according to the present comparative embodiment are caused to emit light. In FIG. 26, a horizontal axis represents a wavelength of light (unit nm), and a vertical axis represents intensity of light (any unit). A dotted line in FIG. 26 is a spectrum diagram for the emission light in the first direction D1, and a solid line in FIG. 26 is a spectrum diagram for the emission light in the second direction D2.

In the present comparative embodiment, as shown in FIG. 26, the emission light in the first direction D1 has higher intensity of the red light and lower intensity of the blue light than those of the emission light in the second direction D2. Thus, the emission light in the first direction D1 has a tinge of red as compared to the emission light in the second direction D2, whereas the emission light in the second direction D2 has a tinge of blue as compared to the emission light in the first direction D1.

Thus, a difference in tinge of the emission light occurs when the display device 2B is visually recognized from the first direction D1 and when the display device 2B is visually recognized from the second direction D2. Therefore, when the display device 2B is visually recognized from each of the first direction D1 and the second direction D2, the white balance of the emission light is lost, and the display quality decreases.

Figure 27:
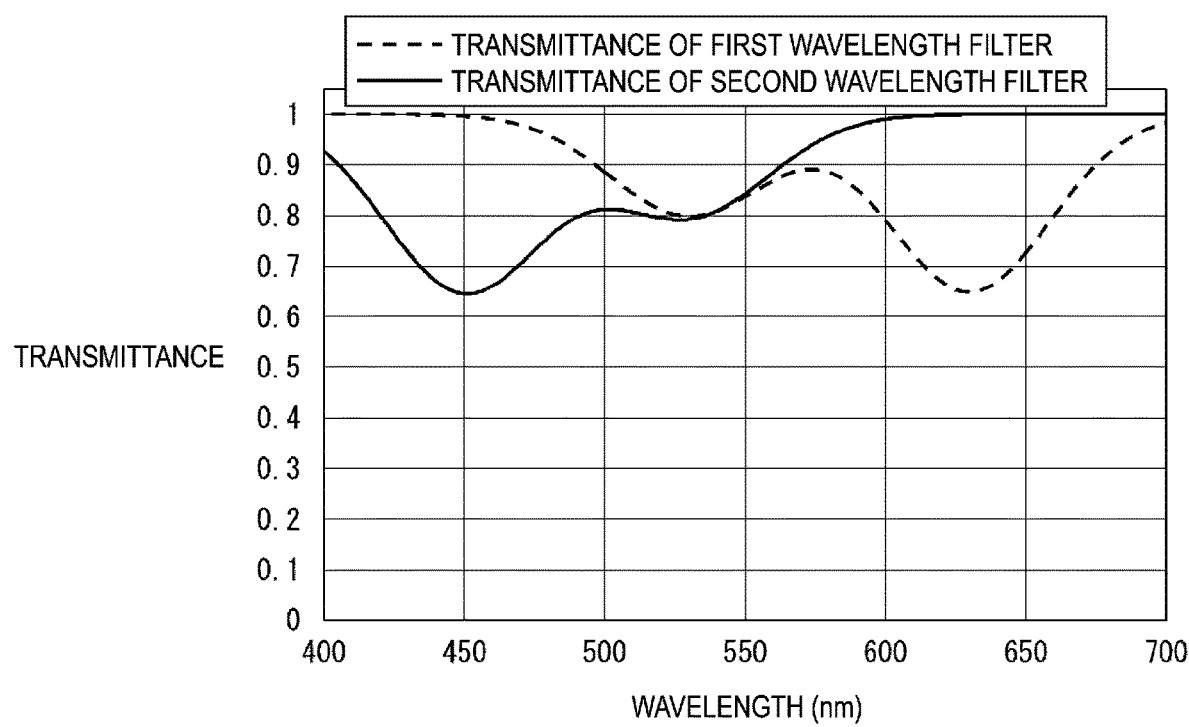
FIG. 27 is a transmission spectrum diagram of an optical filter according to the sixth embodiment of the disclosure.

Here, an example of a difference in the optical characteristics between the first wavelength filter 36 and the second wavelength filter 38 according to each of the embodiments described above will be described with reference to FIG. 27. FIG. 27 is a spectrum diagram for illustrating a difference in the optical characteristics between the first wavelength filter 36 and the second wavelength filter 38 according to the sixth embodiment. In FIG. 27, a horizontal axis represents a wavelength of light (unit nm), and a vertical axis represents a transmittance (unit %). A dotted line in FIG. 27 is a transmission spectrum diagram for the first wavelength filter 36, and a solid line in FIG. 27 is a transmission spectrum diagram for the second wavelength filter 38.

As shown in FIG. 27, the first wavelength filter 36 absorbs the red light more strongly as compared to the second wavelength filter 38. Meanwhile, the second wavelength filter 38 absorbs the blue light more strongly as compared to the first wavelength filter 36. Further, both of the first wavelength filter 36 and the second wavelength filter 38 absorb an equal amount of the green light. However, absorption of the green light is weaker than absorption of the red light in the first wavelength filter 36, and absorption of the green light is weaker than absorption of blue light in the second wavelength filter 38.

Figure 28:
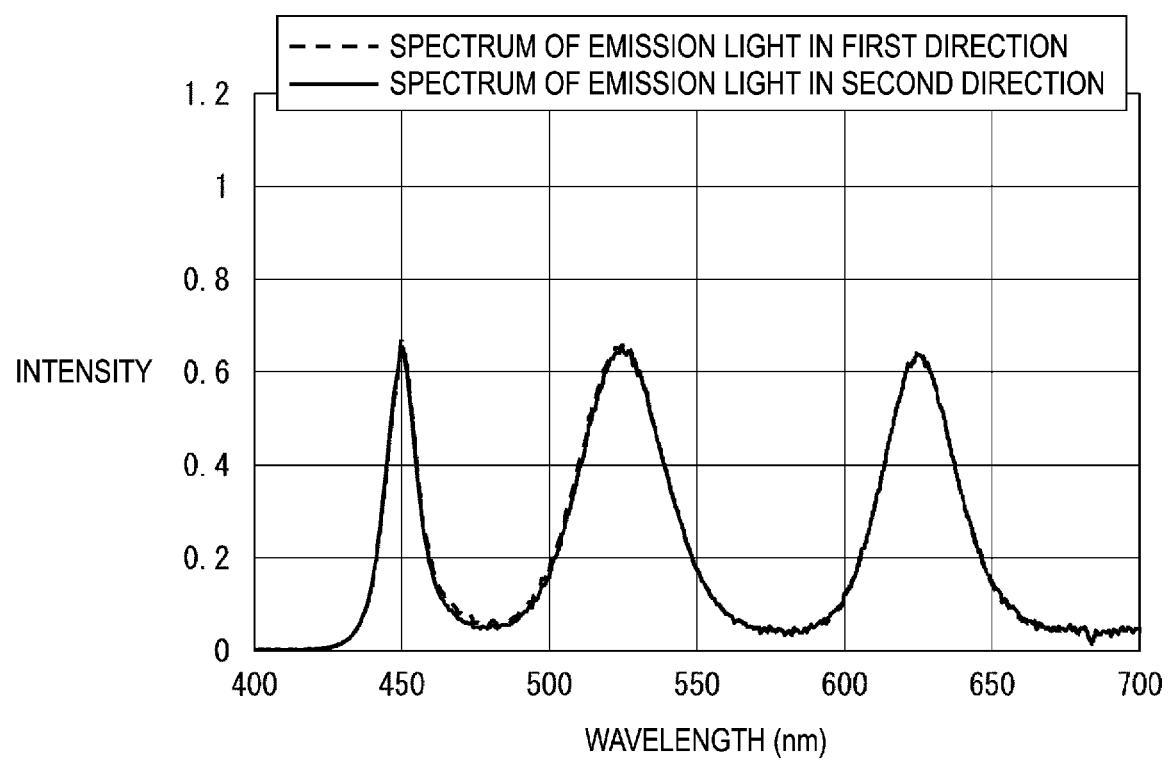
FIG. 28 is a spectrum diagram of emission light of the display device according to the sixth embodiment of the disclosure.

FIG. 28 is a spectrum diagram for light obtained when all of the subpixels of the display device 1102 according to the sixth embodiment are caused to emit light. In FIG. 28, a horizontal axis represents a wavelength of the light (unit nm), and a vertical axis represents intensity of the light (any unit). A dotted line in FIG. 28 is a spectrum diagram for the emission light in the first direction D1, and a solid line in FIG. 28 is a spectrum diagram for the emission light in the second direction D2.

The display device 1102 according to the sixth embodiment has the same configuration as that of the display device 2B according to the second comparative embodiment except for each of the wavelength filters. Therefore, it is conceivable that the emission light from each of the light-emitting element layers before being transmitted through each of the wavelength filters has higher intensity of the red light in the first direction D1 and higher intensity of the blue light in the second direction D2 as shown in FIG. 26.

However, as described above, the display device 1102 according to the sixth embodiment includes the first wavelength filter 36 that absorbs the red light more strongly, and the second wavelength filter 38 that absorbs the blue light more strongly. Therefore, the red light in the emission light transmitted through the first wavelength filter 36 is absorbed more strongly, and the blue light in the emission light transmitted through the second wavelength filter 38 is absorbed more strongly.

Thus, as shown in FIG. 28, the blue light, the green light, and the red light have substantially the same intensity in the emission light in each of the first direction D1 and the second direction D2. Thus, a difference in tinge of the emission light is reduced when the display device 1102 is visually recognized from the first direction D1 and when the display device 1102 is visually recognized from the second direction D2. Therefore, when the display device 1102 is visually recognized from each of the first direction D1 and the second direction D2, the white balance of the emission light is performed, and the display quality is improved.

In the description above, the technique for reducing a difference in tinge of the emission light in the first direction D1 and the second direction D2 of the display device 1102 according to the sixth embodiment is described as an example. However, a difference in tinge of the emission light in the first direction D1 and the second direction D2 can also be reduced by a similar technique in another embodiment.

Specifically, each of corresponding wavelength filters may have a transmittance proportional to an inverse of maximum intensity of the emission light before being transmitted through the color filter in each of the first direction D1 and the second direction D2 from the display device according to each of the third to sixth embodiments.

In other words, in the display device according to each of the third to sixth embodiments, the first wavelength filter 36 may have a transmittance proportional to an inverse of maximum intensity of the emission light in the first direction D1. Similarly, in the display device according to each of the third to sixth embodiments, the second wavelength filter 38 may have a transmittance proportional to an inverse of maximum intensity of the emission light in the second direction D2.

Seventh Embodiment

Figure 29:
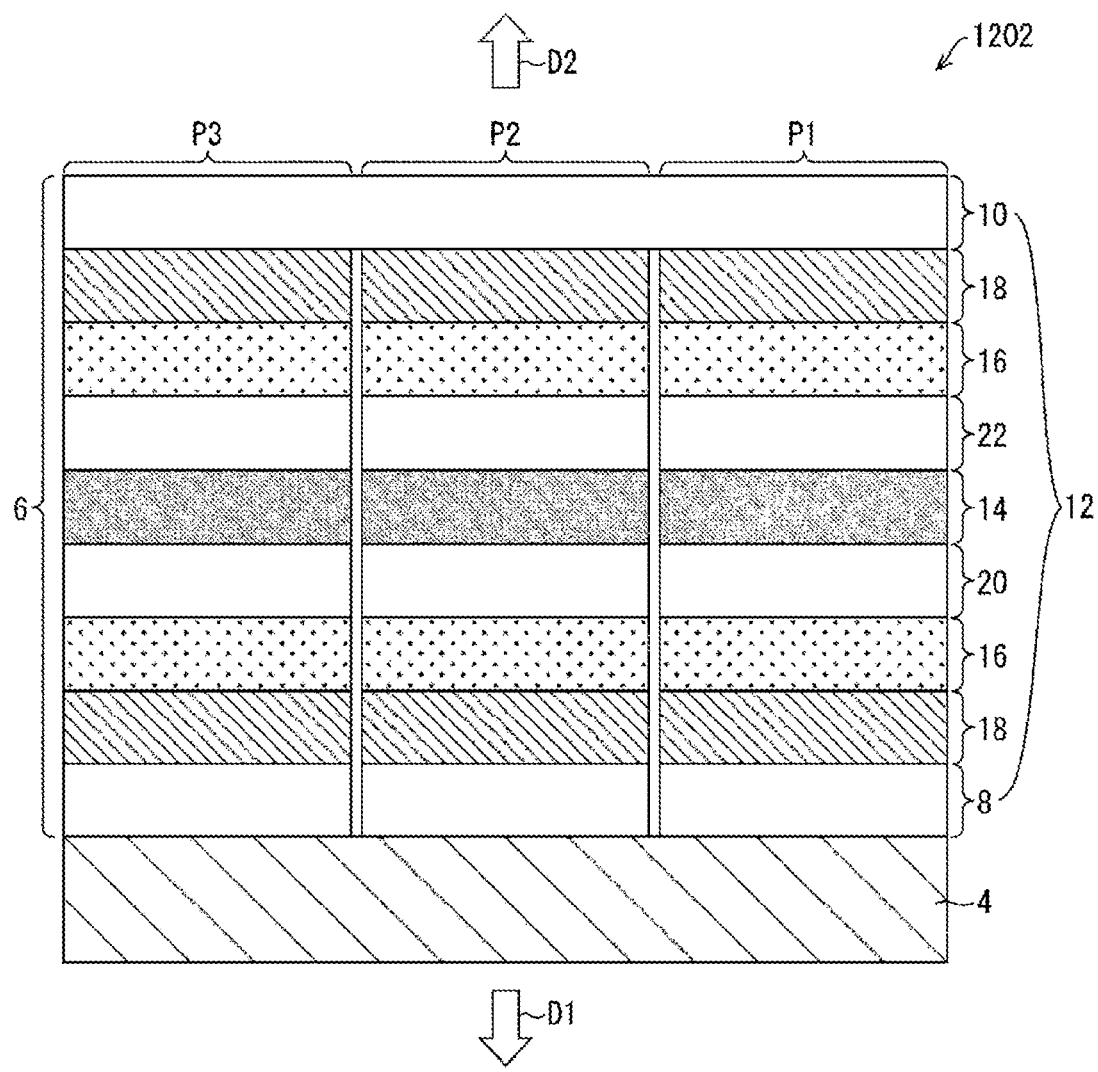
FIG. 29 is a schematic cross-sectional view of a display device according to a seventh embodiment of the disclosure.

FIG. 29 is a schematic cross-sectional view illustrating a display device 1202 according to the present embodiment.

As compared to the display device 2 according to the first embodiment, the display device 1202 according to the present embodiment further includes, between a hole transport layer 22 and an anode electrode 10, a green light-emitting layer 16 and a red light-emitting layer 18 in an order from the hole transport layer 22 side as illustrated in FIG. 29.

In other words, the display device 1202 according to the present embodiment includes the green light-emitting layer 16 as a second light-emitting layer and the red light-emitting layer 18 as a third light-emitting layer closer to a light emission side in the first direction D1 than a blue light-emitting layer 14 as a first light-emitting layer. Furthermore, the display device 1202 according to the present embodiment includes the green light-emitting layer 16 as a fourth light-emitting layer and the red light-emitting layer 18 as a fifth light-emitting layer closer to a light emission side in the second direction D2 than the blue light-emitting layer 14.

Here, the layers from the red light-emitting layer 18 closer to the light emission side in the first direction D1 than the blue light-emitting layer 14 to the red light-emitting layer 18 closer to the light emission side in the second direction D2 than the blue light-emitting layer 14 overlap. Further, each of the green light-emitting layer 16 and the red light-emitting layer 18 closer to the light emission side in the second direction D2 than the blue light-emitting layer 14 has the same configuration as that of each of the green light-emitting layer 16 and the red light-emitting layer 18 closer to the light emission side in the first direction D1 than the blue light-emitting layer 14.

Except for the points described above, the display device 1202 according to the present embodiment has the same configuration as that of the display device 2 according to the first embodiment.

Note that, as compared to the display device 2 according to the first embodiment, the display device 1202 according to the present embodiment may not include the first color filter 24 and the second color filter 26 as illustrated in FIG. 29. In other words, the display device 1202 according to the present embodiment may not include a first optical filter and a second optical filter.

Figure 30:
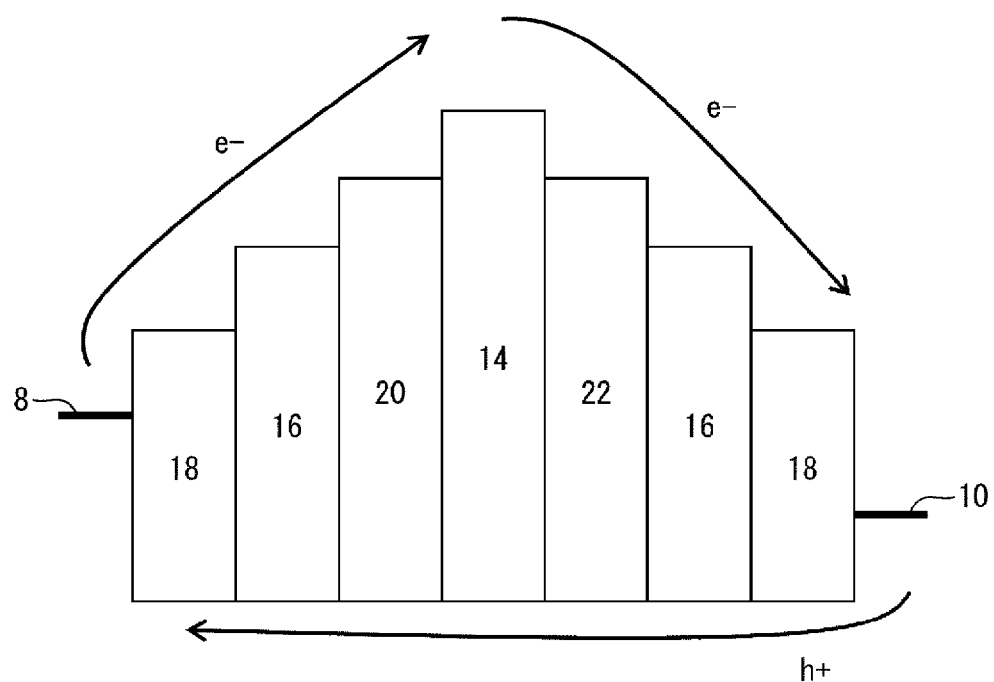
FIG. 30 is an energy band diagram illustrating an example of a Fermi level or a band gap of each layer in a light-emitting element layer of the display device according to the seventh embodiment of the disclosure.

FIG. 30 is an energy band diagram illustrating an example of a Fermi level or a band gap of each layer in the light-emitting element layer according to the present embodiment.

As illustrated in FIG. 30, in the present embodiment, the electron affinity of each layer from the red light-emitting layer 18 on a cathode electrode 8 side to the blue light-emitting layer 14 gradually decreases. Further, the electron affinity of each layer from the blue light-emitting layer 14 to the red light-emitting layer 18 on the anode electrode 10 side gradually increases. Thus, when an electrode pair 12 is driven, the electron injected from the cathode electrode 8 into the red light-emitting layer 18 on the cathode electrode 8 side is relatively easily and sequentially transported to each layer to the red light-emitting layer 18 on the anode electrode 10 side as indicated by an arrow e-in FIG. 30.

Further, as illustrated in FIG. 30, in the present embodiment, the ionization potential of each layer from the red light-emitting layer 18 on the anode electrode 10 side to the red light-emitting layer 18 on the cathode electrode 8 side does not fluctuate greatly. Thus, when the electrode pair 12 is driven, the positive hole injected from the anode electrode 10 into the red light-emitting layer 18 on the anode electrode 10 side is relatively easily and sequentially transported to each layer to the red light-emitting layer 18 on the cathode electrode 8 side as indicated by an arrow h+ in FIG. 30.

Thus, when the electrode pair 12 is driven, the electron and the positive hole are transported to each of the light-emitting layers from the cathode electrode 8 to the anode electrode 10. Therefore, each of the light-emitting layers from the cathode electrode 8 to the anode electrode 10 emits light by the injection-type electroluminescence. In other words, each of the light-emitting layers of the display device 1202 according to the present embodiment emits light in the electroluminescence mode.

Thus, the blue light from the blue light-emitting layer 14, the green light from the two green light-emitting layers 16, and the red light from the two red light-emitting layers 18 are emitted from a light-emitting element layer 6, and, as a result, the white light is emitted from the light-emitting element layer 6. The light from each of the light-emitting layers is emitted in both of the direction to the cathode electrode 8, that is, the first direction D1, and the direction to the anode electrode 10, that is, the second direction D2.

In the present embodiment, the display device 1202 includes a subpixel at each of intersection points between the cathode electrode 8 and the anode electrode 10 in the plan view. Thus, similarly to the display device 702 according to the fourth embodiment, the display device 1202 in the present embodiment can drive the electrode pair 12 on a subpixel-by-subpixel basis, and achieves a display device that enables monochrome display.

Figure 31:
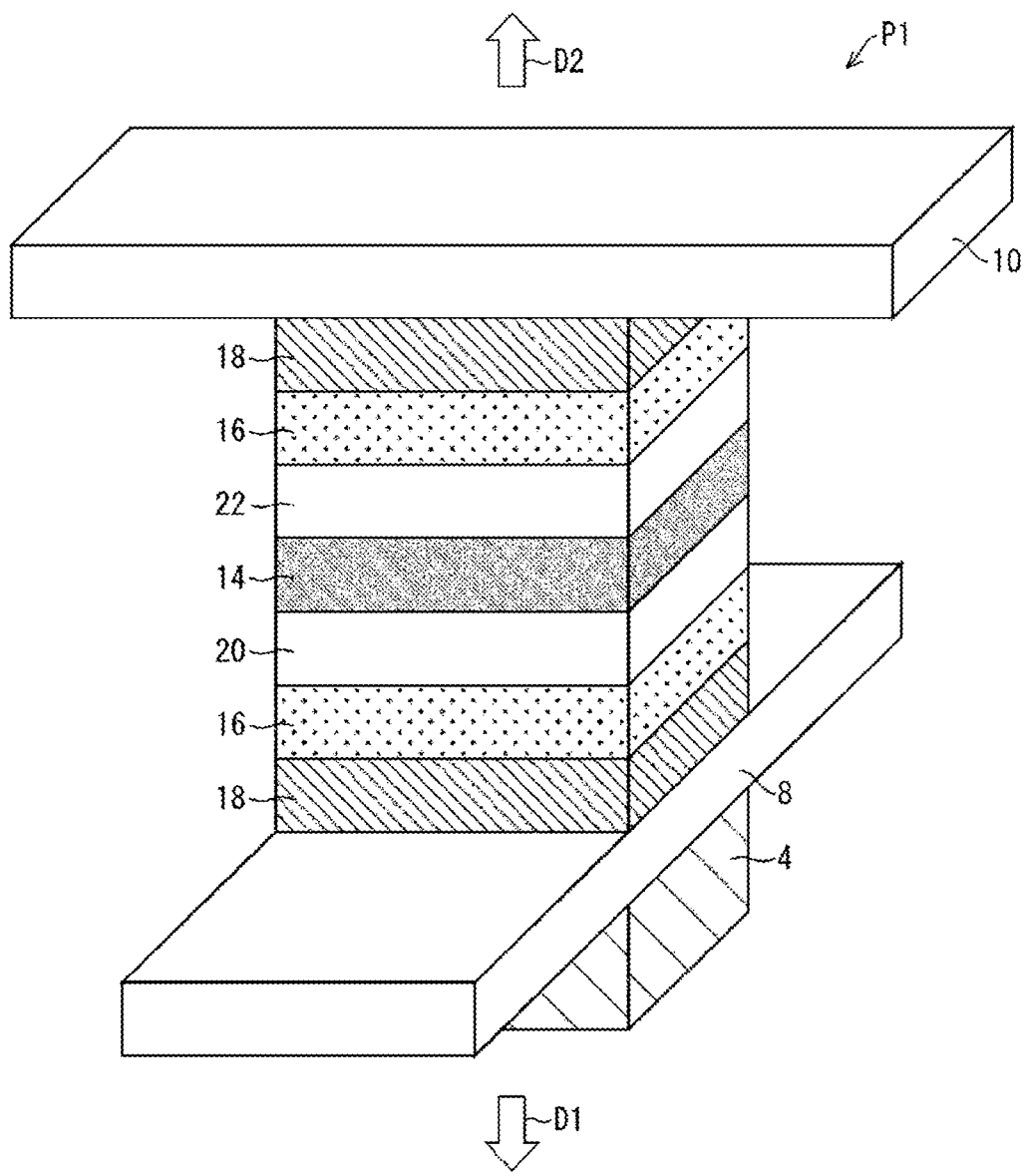
FIG. 31 is a schematic perspective view of a first subpixel of the display device according to the seventh embodiment of the disclosure.

Note that FIG. 29 illustrates a first subpixel P1, a second subpixel P2, and a third subpixel P3 as an example of the subpixels. FIG. 31 is a schematic perspective view illustrating the first subpixel P1 according to the present embodiment. In the present embodiment, each of the subpixels included in the display device 1202 may have the same configuration as that of the first subpixel P1 illustrated in FIG. 31.

In the present embodiment, the display device 1202 includes the green light-emitting layer 16 and the red light-emitting layer 18 symmetrically with respect to the blue light-emitting layer 14 in the first direction D1 and the second direction D2. This reduces a difference in positional relationship of each of the light-emitting layers when the display device 1202 according to the present embodiment is visually recognized from each of the first direction D1 and the second direction D2. Therefore, the display device 1202 according to the present embodiment can reduce a difference in tinge when visually recognized from each of the first direction D1 and the second direction D2 different from each other, and can also improve the display quality in both of the directions.

Note that, in the present embodiment, a thickness of each of the green light-emitting layer 16 and the red light-emitting layer 18 may be formed thinner than that of the blue light-emitting layer 14. In this way, as compared to the two green light-emitting layers 16 and the two red light-emitting layers 18 included in one subpixel, brightness from only one blue light-emitting layer 14 included in one subpixel can be improved, and the white balance of the emission light from the display device 1202 is further improved. Further, the amount of carriers that recombine in the green light-emitting layer 16 and the red light-emitting layer 18 is reduced, and the carriers are easily injected into the blue light-emitting layer 14. In this way, luminous efficiency of the blue light-emitting layer 14 can be further improved.

Modified Example

Figure 32:
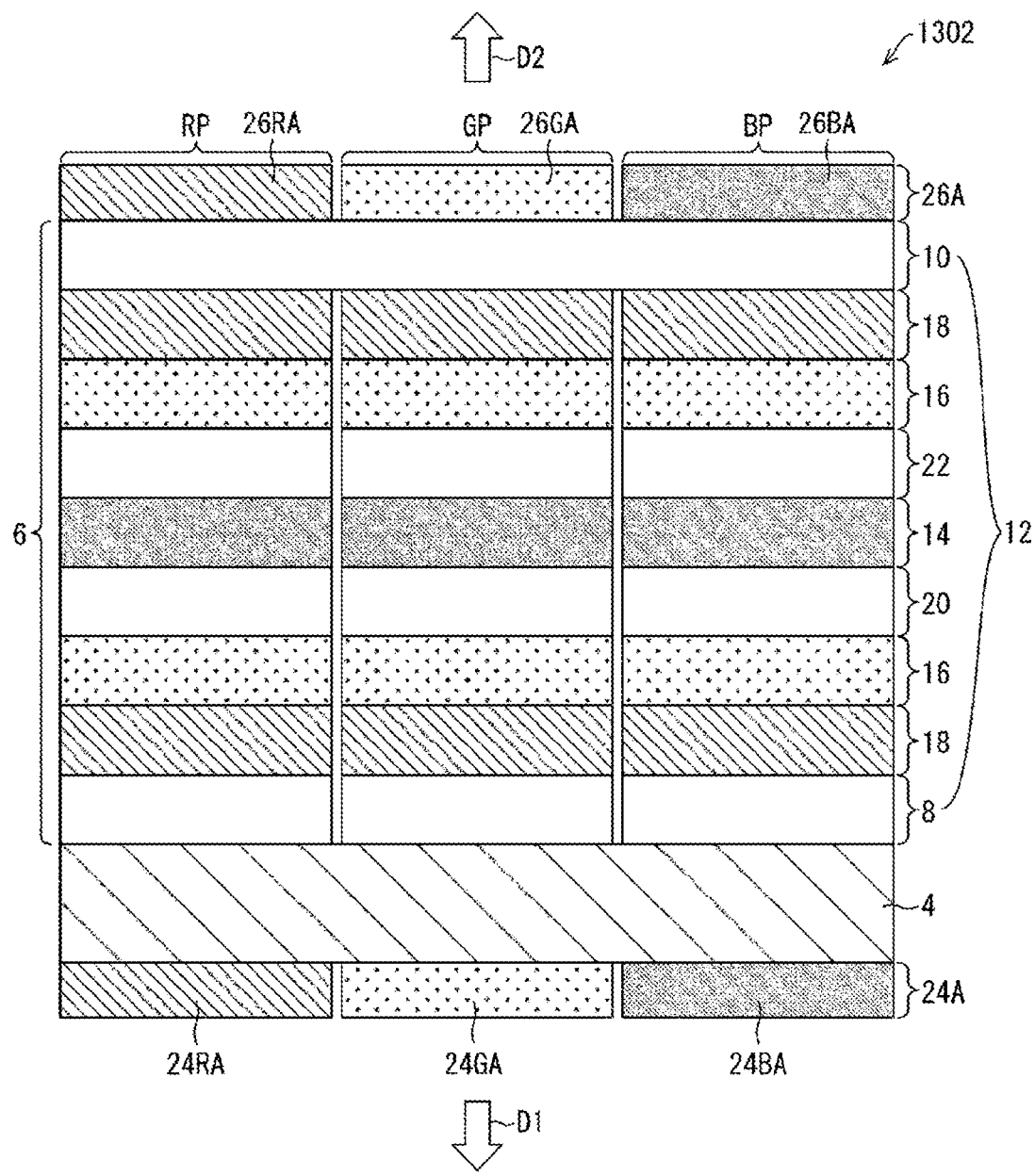
FIG. 32 is a schematic cross-sectional view of a display device according to a modified example of the seventh embodiment of the disclosure.

FIG. 32 is a schematic cross-sectional view illustrating a display device 1302 according to a modified example of the present embodiment.

As compared to the display device 1202 according to the present embodiment, the display device 1302 according to the present modified example includes a first color filter 24A closer to the first direction D1 side than the cathode electrode 8. Further, as compared to the display device 1202 according to the present embodiment, the display device 1302 according to the present modified example includes a second color filter 26A closer to the second direction D2 side than the anode electrode 10.

In the present modified example, each of the first color filter 24A and the second color filter 26A has the same configuration as that of each of the first color filter 24A and the second color filter 26A described in the first comparative embodiment. In other words, the first color filter 24A and the second color filter 26A may have the same optical characteristics.

Thus, similarly to the display device 2 according to the first embodiment, a blue subpixel BP is formed in a position in which a first blue color filter 24BA and a second blue color filter 26BA are formed in the plan view. Further, a green subpixel GP is formed in a position in which a first green color filter 24GA and a second green color filter 26GA are formed in the plan view. Similarly, a red subpixel RP is formed in a position in which a first red color filter 24RA and a second red color filter 26RA are formed in the plan view. Therefore, the display device 1302 according to the present modified example achieves color display by controlling drive of each of the subpixels.

Except for the points described above, the display device 1302 according to the present modified example has the same configuration as that of the display device 1202 according to the present embodiment.

Similarly to the display device 1202 according to the present embodiment, the display device 1302 according to the present modified example can have a configuration that can reduce a difference in tinge when visually recognized from each of the first direction D1 and the second direction D2 different from each other.

Further, the display device 1302 according to the present modified example includes the green light-emitting layer 16 and the red light-emitting layer 18 symmetrically with respect to the blue light-emitting layer 14 in the first direction D1 and the second direction D2. Thus, when the optical characteristics of the first red color filter 24RA and the second red color filter 26RA are the same for reducing a difference in tinge described above, a difference in tinge when visually recognized from each of the first direction D1 and the second direction D2 can also be reduced. Therefore, in the present modified example, a display device that enables color display can be achieved only by employing, for example, the same known color filter in the related art as the first red color filter 24RA and the second red color filter 26RA.

Eighth Embodiment

Figure 33:
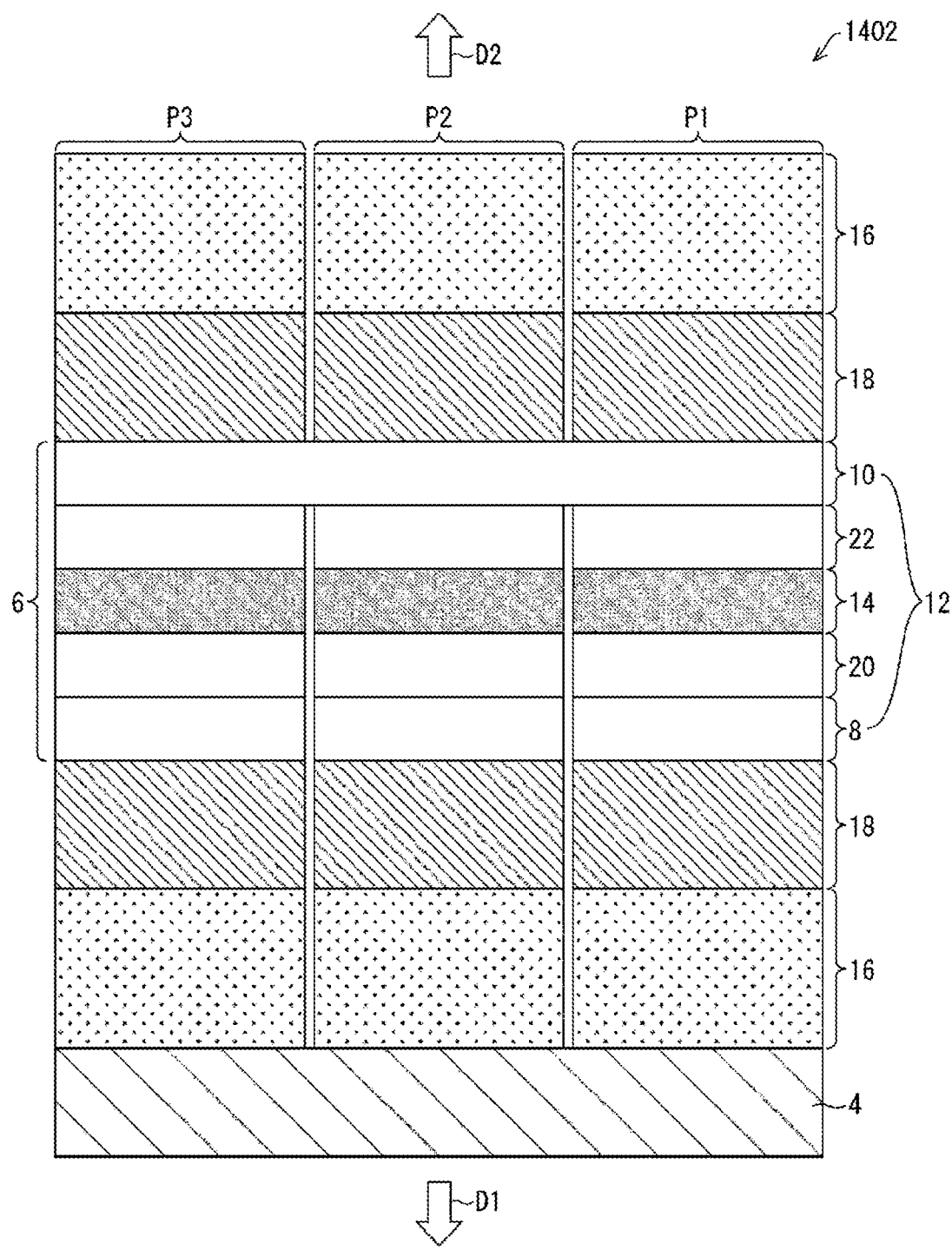
FIG. 33 is a schematic cross-sectional view of a display device according to an eighth embodiment of the disclosure.

FIG. 33 is a schematic cross-sectional view illustrating a display device 1402 according to the present embodiment.

As compared to the display device 202 according to the second embodiment, the display device 1402 according to the present embodiment further includes a green light-emitting layer 16 and a red light-emitting layer 18 in an order from a substrate 4 side and closer to the first direction D1 side than a cathode electrode 8 as illustrated in FIG. 33.

Similarly to the previous embodiment, also in the present embodiment, layers from the green light-emitting layer 16 closer to the light emission side in the first direction D1 than a blue light-emitting layer 14 to the green light-emitting layer 16 closer to the light emission side in the second direction D2 than the blue light-emitting layer 14 overlap. Further, each of the green light-emitting layer 16 and the red light-emitting layer 18 closer to the light emission side in the first direction D1 than the blue light-emitting layer 14 has the same configuration as that of each of the green light-emitting layer 16 and the red light-emitting layer 18 closer to the light emission side in the second direction D2 than the blue light-emitting layer 14.

Except for the points described above, the display device 1402 according to the present embodiment has the same configuration as that of the display device 202 according to the second embodiment.

Note that, as compared to the display device 202 according to the second embodiment, the display device 1402 according to the present embodiment may not include the first color filter 24 and the second color filter 26 as illustrated in FIG. 33. In other words, the display device 1402 according to the present embodiment may not include a first optical filter and a second optical filter.

In the present embodiment, the green light-emitting layer 16 and the red light-emitting layer 18 closer to the first direction D1 side than the blue light-emitting layer 14 emit light by the photoexcitation by the blue light from a light-emitting element layer 6 similarly to the green light-emitting layer 16 and the red light-emitting layer 18 closer to the second direction D2 side than the blue light-emitting layer 14.

Thus, the blue light from the blue light-emitting layer 14, the green light from the two green light-emitting layers 16, and the red light from the two red light-emitting layers 18 are emitted from the light-emitting element layer 6, and, as a result, the white light is emitted from the light-emitting element layer 6. The light from each of the light-emitting layers is emitted in both of the first direction D1 and the second direction D2.

In the present embodiment, the display device 1402 includes a subpixel at each of intersection points between the cathode electrode 8 and an anode electrode 10 in the plan view. Thus, similarly to the display device 702 according to the fourth embodiment, the display device 1402 in the present embodiment can drive an electrode pair 12 on a subpixel-by-subpixel basis, and achieves a display device that enables monochrome display.

Figure 34:
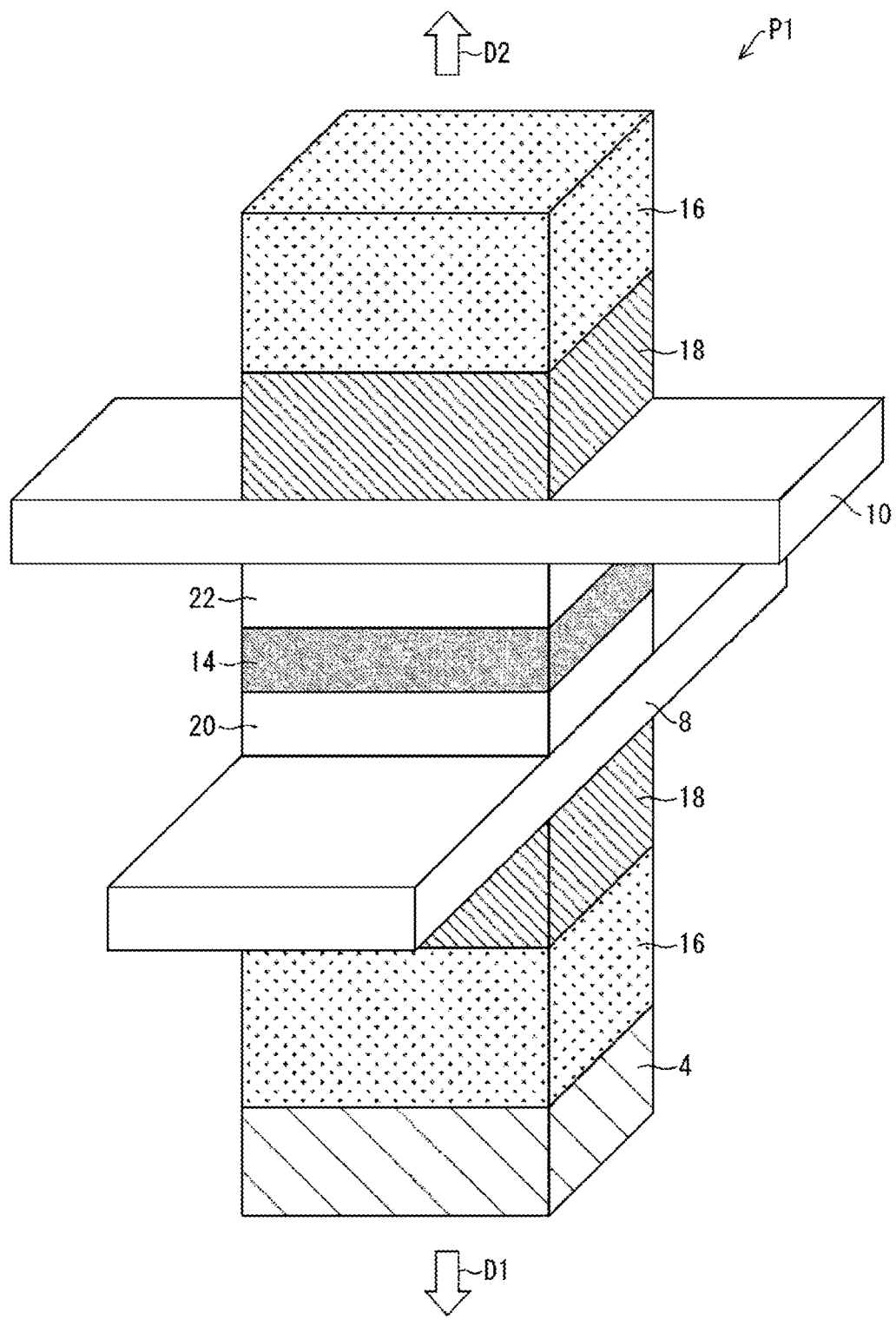
FIG. 34 is a schematic perspective view of a first subpixel of the display device according to the eighth embodiment of the disclosure.

Note that FIG. 33 illustrates a first subpixel P1, a second subpixel P2, and a third subpixel P3 as an example of the subpixels. FIG. 34 is a schematic perspective view illustrating the first subpixel P1 according to the present embodiment. In the present embodiment, each of the subpixels included in the display device 1402 may have the same configuration as that of the first subpixel P1 illustrated in FIG. 34.

In the present embodiment, the display device 1402 includes the green light-emitting layer 16 and the red light-emitting layer 18 symmetrically with respect to the blue light-emitting layer 14 in the first direction D1 and the second direction D2. This reduces a difference in positional relationship of each of the light-emitting layers when the display device 1402 according to the present embodiment is visually recognized from each of the first direction D1 and the second direction D2. Therefore, the display device 1402 according to the present embodiment can reduce a difference in tinge when visually recognized from each of the first direction D1 and the second direction D2 different from each other, and can improve the display quality in both of the directions.

Ninth Embodiment

Figure 35:
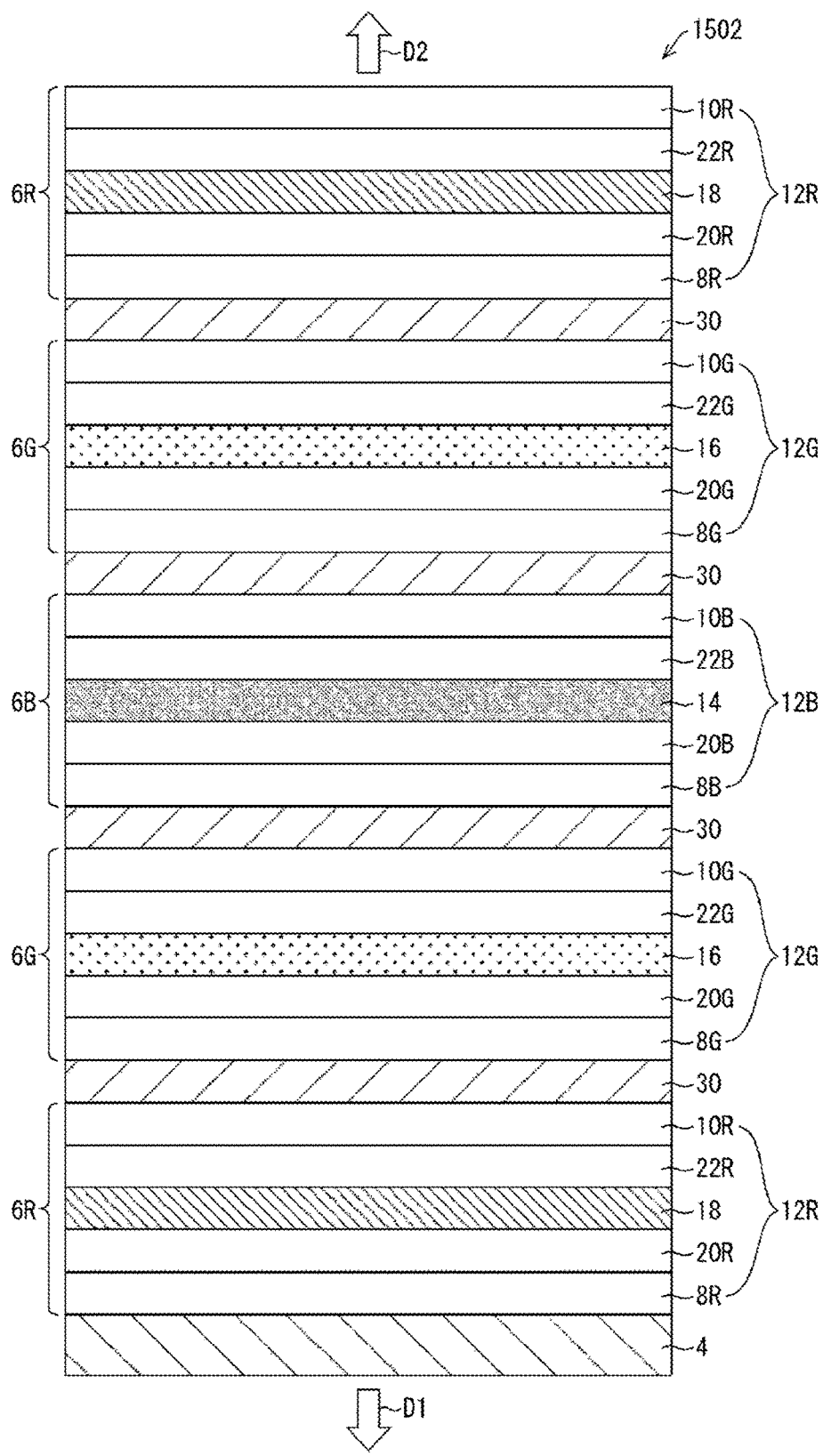
FIG. 35 is a schematic cross-sectional view of a display device according to a ninth embodiment of the disclosure.
Figure 36:
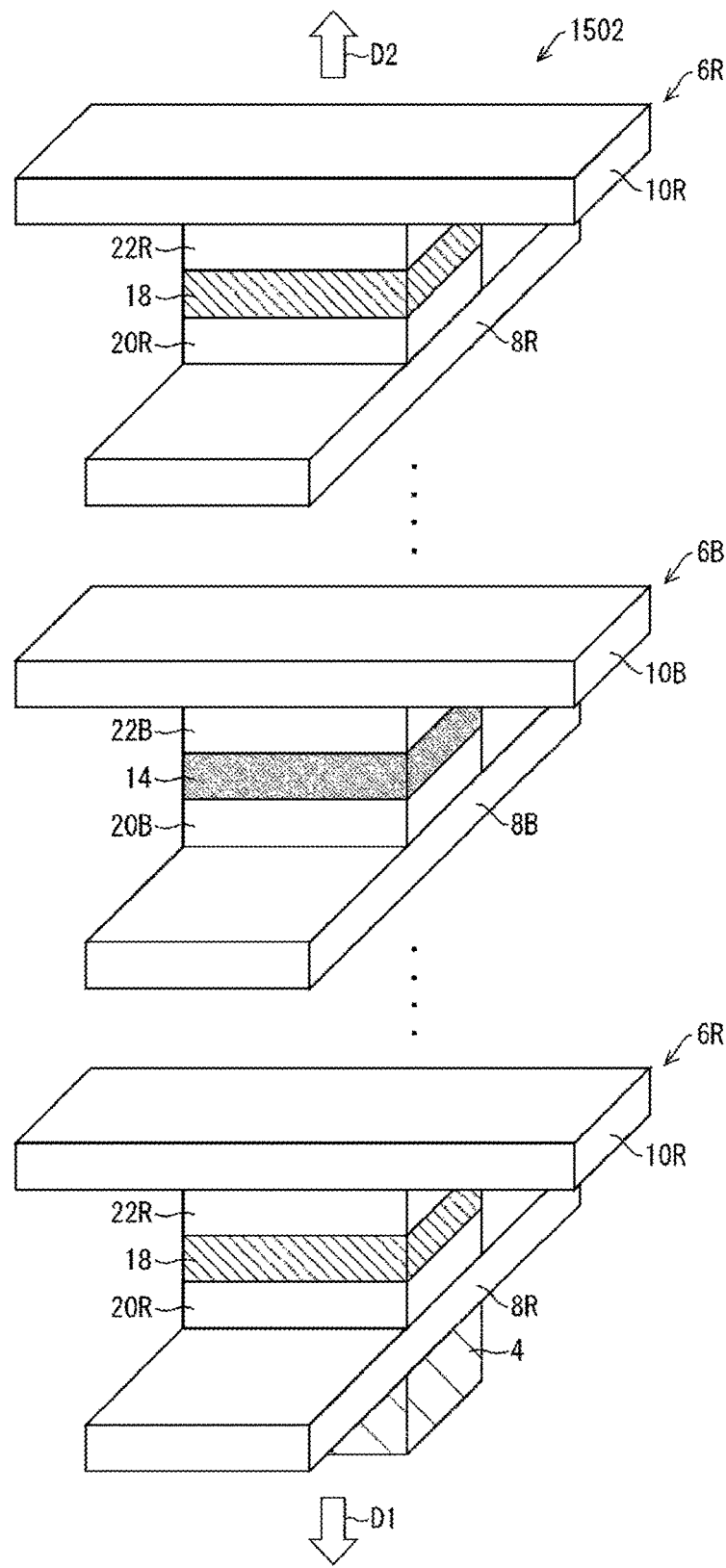
FIG. 36 is a schematic perspective view of the display device according to the ninth embodiment of the disclosure.

FIG. 35 is a schematic cross-sectional view illustrating a display device 1502 according to the present embodiment. FIG. 36 is a schematic perspective view illustrating the display device 1502 according to the present embodiment. Note that FIG. 36 extracts and illustrates only a substrate 4, a blue light-emitting element layer 6B, and a red light-emitting element layer 6R.

As compared to the display device 402 according to the third embodiment, the display device 1502 according to the present embodiment includes a green light-emitting element layer 6G and the red light-emitting element layer 6R in an order from the blue light-emitting element layer 6B side and closer to the second direction D2 side than the blue light-emitting element layer 6B. Note that an insulating layer 30 is also formed closer to the second direction D2 side than the blue light-emitting element layer 6B between the blue light-emitting element layer 6B and the green light-emitting element layer 6G and between the green light-emitting element layer 6G and the red light-emitting element layer 6R.

Each of the green light-emitting element layer 6G and the red light-emitting element layer 6R closer to the second direction D2 side than the blue light-emitting element layer 6B has the same configuration as that of each of the green light-emitting element layer 6G and the red light-emitting element layer 6R closer to the first direction D1 side than the blue light-emitting element layer 6B.

In other words, the green light-emitting element layer 6G closer to the second direction D2 side than the blue light-emitting element layer 6B includes an electrode pair 12G as a fourth electrode pair including a cathode electrode 8G as a fourth cathode electrode and an anode electrode 10G as a fourth anode electrode. An electron transport layer 20G as a fourth electron transport layer, a green light-emitting layer 16 as a fourth light-emitting layer, and a hole transport layer 22G as a fourth hole transport layer are formed between the electrode pair 12G from the cathode electrode 8G side.

Further, the red light-emitting element layer 6R closer to the second direction D2 side than the blue light-emitting element layer 6B includes an electrode pair 12R as a fifth electrode pair including a cathode electrode 8R as a fifth cathode electrode and an anode electrode 10R as a fifth anode electrode. An electron transport layer 20R as a fifth electron transport layer, a red light-emitting layer 18 as a fifth light-emitting layer, and a hole transport layer 22R as a fifth hole transport layer are formed between the electrode pair 12R from the cathode electrode 8R side.

Further, similarly to each of the electrode pair 12G and the electrode pair 12R closer to the first direction D1 side than the blue light-emitting element layer 6B, each of the electrode pair 12G and the electrode pair 12R closer to the second direction D2 side than the blue light-emitting element layer 6B can be individually driven.

Similarly to the display device 1102 according to the sixth embodiment, the display device 1502 according to the present embodiment can individually drive each of the one blue light-emitting element layer 6B, the two green light-emitting element layers 6G, and the two red light-emitting element layers 6R. Thus, although the display device 1502 according to the present embodiment does not include a color filter, the multi-color emission light can be obtained.

For example, a unit including one blue light-emitting element layer 6B, two green light-emitting element layers 6G, and two red light-emitting element layers 6R illustrated in FIG. 35 may be set as one pixel, and a plurality of units may be included and arranged in parallel in the plan view. In this way, the display device 1502 according to the present embodiment achieves a display device that enables color display.

Except for the points described above, the display device 1502 according to the present embodiment has the same configuration as that of the display device 402 according to the third embodiment.

Note that, as compared to the display device 402 according to the third embodiment, the display device 1502 according to the present embodiment may not include the first color filter 24 and the second color filter 26 as illustrated in FIGS. 35 and 36. In other words, the display device 1502 according to the present embodiment may not include a first optical filter and a second optical filter.

In the present embodiment, the display device 1502 includes the green light-emitting layer 16 and the red light-emitting layer 18 symmetrically with respect to the blue light-emitting layer 14 in the first direction D1 and the second direction D2. Specifically, in the present embodiment, the display device 1502 includes the green light-emitting element layer 6G and the red light-emitting element layer 6R symmetrically with respect to the blue light-emitting element layer 6B in the first direction D1 and the second direction D2.

This reduces a difference in positional relationship of each of the light-emitting layers and each of the light-emitting element layers when the display device 1502 according to the present embodiment is visually recognized from each of the first direction D1 and the second direction D2. Therefore, the display device 1502 according to the present embodiment can reduce a difference in tinge when visually recognized from each of the first direction D1 and the second direction D2 different from each other, and can improve the display quality in both of the directions.

Note that, in the present embodiment, an order in which the light-emitting element layers are layered may be any order as long as the order is symmetric in the first direction D1 and the second direction D2. For example, in the present embodiment, formation positions of the green light-emitting element layer 6G and the red light-emitting element layer 6R illustrated in FIG. 35 may be replaced with each other. Here, from a perspective of being able to form the display device 1502 only by forming one layer of the high-cost blue light-emitting element 14, it is preferable to layer the light-emitting element layers with the blue light-emitting element layer 6B as the center.

However, the layering order of the light-emitting element layers according to the present embodiment is not limited thereto. For example, instead of disposing the blue light-emitting element layer 6B at the center, the green light-emitting element layer 6G or the red light-emitting element layer 6R may be disposed at the center, and the light-emitting element layers may be layered thereon.

The disclosure is not limited to the embodiments described above, and various modifications may be made within the scope of the claims. Embodiments obtained by appropriately combining technical approaches disclosed in the different embodiments also fall within the technical scope of the disclosure. Furthermore, novel technical features can be formed by combining the technical approaches disclosed in each of the embodiments.

The invention claimed is:

1. A light-emitting device configured to emit light in a first direction and also emit light in a second direction opposite the first direction, the light-emitting device comprising:
a first light-emitting layer configured to emit light of a first color;
a second light-emitting layer configured to emit light of a second color different from the first color;
a first electrode pair including a pair of a first anode electrode and a first cathode electrode; and
a second electrode pair being different from the first electrode pair and including at least a pair of a second anode electrode and a second cathode electrode, wherein:
in the first electrode pair,
a first electron transport layer is located on a first cathode electrode side, and
a first hole transport layer is located on a first anode electrode side and overlaps the first electron transport layer;
the first light-emitting layer is included between the first electron transport layer and the first hole transport layer,
the first light-emitting layer and the second light-emitting layer overlap each other as viewed from the first direction, a first optical filter overlaps the first light-emitting layer and the second light-emitting layer as viewed from the first direction, and is located closer to a first direction side than the first light-emitting layer and the second light-emitting layer, a second optical filter overlaps the first light-emitting layer and the second light-emitting layer as viewed from the second direction, and is located closer to a second direction side than the first light-emitting layer and the second light-emitting layer, the first optical filter has an optical characteristic different from an optical characteristic of the second optical filter, the first light-emitting layer is included only between the first electrode pair, the second light-emitting layer is included only between the second electrode pair, the first optical filter further has a transmittance proportional to an inverse of a maximum intensity of light in the first direction, and the second optical filter has a transmittance proportional to an inverse of a maximum intensity of light in the second direction.

2. The light-emitting device according to claim 1, wherein at least a second electron transport layer on a second cathode electrode side, and a second hole transport layer on a second anode electrode side, overlapping the second electron transport layer, are included between the second electrode pair, and the second light-emitting layer is included between the second electron transport layer and the second hole transport layer.

3. The light-emitting device according to claim 1, wherein the second light-emitting layer includes a quantum dot material.

4. The light-emitting device according to claim 1, further comprising:

a third light-emitting layer configured to emit light of a third color, different from the first color and the second color, between the first optical filter and the second optical filter, wherein the third light-emitting layer overlaps both of the first light-emitting layer and the second light-emitting layer.

5. The light-emitting device according to claim 4, wherein the first light-emitting layer emits light by injection-type electroluminescence, and each of the second light-emitting layer and the third light-emitting layer emits light by photoexcitation by the light from the first light-emitting layer.

6. The light-emitting device according to claim 5, wherein the second light-emitting layer and the third light-emitting layer are included between one of electrodes of the first electrode pair on the first direction side and the first optical filter or between another one of the electrodes of the first electrode pair on the second direction side and the second optical filter.

7. The light-emitting device according to claim 1, further comprising:

a third light-emitting layer configured to emit light of a third color different from the first color and the second color; and a third electrode pair including at least a pair of a third anode electrode and a third cathode electrode and being different from the first electrode pair and the second electrode pair, wherein the third light-emitting layer is included only between the third electrode pair.

8. The light-emitting device according to claim 7, wherein at least a third electron transport layer on a third cathode electrode side, and a third hole transport layer on a third anode electrode side, overlapping the third electron transport layer, are included between the third electrode pair, and the third light-emitting layer is included between the third electron transport layer and the third hole transport layer.

9. The light-emitting device according to claim 4, wherein the third light-emitting layer includes a quantum dot material.

10. A light-emitting device configured to emit light in a first direction and also emit light in a second direction opposite the first direction, the light-emitting device comprising:

a first light-emitting layer configured to emit light of a first color;

a second light-emitting layer configured to emit light of a second color different from the first color; and a first electrode pair including a pair of a first anode electrode and a first cathode electrode, wherein:

in the first electrode pair,
  a first electron transport layer is located on a first cathode electrode side, and
  a first hole transport layer is located on a first anode electrode side and overlaps the first electron transport layer, the first light-emitting layer is included between the first electron transport layer and the first hole transport layer, the first light-emitting layer and the second light-emitting layer overlap each other as viewed from the first direction, a first optical filter overlaps the first light-emitting layer and the second light-emitting layer as viewed from the first direction, and is located closer to a first direction side than the first light-emitting layer and the second light-emitting layer, a second optical filter overlaps the first light-emitting layer and the second light-emitting layer as viewed from the second direction, and is located closer to a second direction side than the first light-emitting layer and the second light-emitting layer, the first optical filter has an optical characteristic different from an optical characteristic of the second optical filter, the first optical filter further has a transmittance proportional to an inverse of a maximum intensity of light in the first direction, and the second optical filter has a transmittance proportional to an inverse of a maximum intensity of light in the second direction.

* * * * *